(12) United States Patent
Asami

(10) Patent No.: US 10,490,116 B2
(45) Date of Patent: Nov. 26, 2019

(54) SEMICONDUCTOR DEVICE, MEMORY DEVICE, AND DISPLAY SYSTEM

(71) Applicant: Semiconductor Energy Laboratory Co., Ltd., Atsugi-shi, Kanagawa-ken (JP)

(72) Inventor: Yoshinobu Asami, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 97 days.

(21) Appl. No.: 15/630,025

(22) Filed: Jun. 22, 2017

(65) Prior Publication Data

US 2018/0012538 A1 Jan. 11, 2018

(30) Foreign Application Priority Data

Jul. 6, 2016 (JP) .................... 2016-134445

(51) Int. Cl.
*G11C 5/02* (2006.01)
*G09G 3/20* (2006.01)
(Continued)

(52) U.S. Cl.
CPC ......... *G09G 3/2096* (2013.01); *G09G 3/3225* (2013.01); *G09G 3/3648* (2013.01);
(Continued)

(58) Field of Classification Search
CPC .. G09G 3/2096; G09G 3/3225; G09G 3/3648; G09G 2300/0426;
(Continued)

(56) References Cited

U.S. PATENT DOCUMENTS

| 4,466,081 A | 8/1984 | Masuoka |
| 5,001,539 A | 3/1991 | Inoue et al. |

(Continued)

FOREIGN PATENT DOCUMENTS

| JP | 2002-368226 A | 12/2002 |
| JP | 2012-256400 A | 12/2012 |

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Mohammed A Bashar
(74) *Attorney, Agent, or Firm* — Robinson Intellectual Property Law Office; Eric J. Robinson

(57) ABSTRACT

A novel semiconductor device or a highly reliable semiconductor device is provided. The on/off state of a transistor which functions as a switch for writing data is controlled using the potential of a potential hold portion. The potential of the potential hold portion is controlled using a plurality of capacitors, whereby both a positive potential and a negative potential can be held in the potential hold portion. Accordingly, deterioration of the transistor which functions as the switch for writing data can be prevented and the characteristics of the transistor can be maintained. Therefore, the highly reliable semiconductor device can be provided.

14 Claims, 21 Drawing Sheets

(51) Int. Cl.

| | | |
|---|---|---|
| *G09G 3/3225* | (2016.01) | |
| *G09G 3/36* | (2006.01) | |
| *G11C 7/12* | (2006.01) | |
| *H01L 27/12* | (2006.01) | |
| *G11C 11/412* | (2006.01) | |
| *G02F 1/1362* | (2006.01) | |
| *G02F 1/1368* | (2006.01) | |
| *G11C 11/401* | (2006.01) | |

(52) U.S. Cl.
CPC .............. *G11C 7/12* (2013.01); *G11C 11/412* (2013.01); *H01L 27/124* (2013.01); *H01L 27/1225* (2013.01); *G02F 1/1368* (2013.01); *G02F 1/136286* (2013.01); *G09G 2300/0426* (2013.01); *G09G 2310/08* (2013.01); *G09G 2320/043* (2013.01); *G09G 2320/0626* (2013.01); *G09G 2330/023* (2013.01); *G09G 2360/12* (2013.01); *G09G 2360/144* (2013.01); *G11C 11/401* (2013.01)

(58) Field of Classification Search
CPC ......... G09G 2330/023; G09G 2360/12; G09G 2360/144; G09G 2310/08; G09G 2320/043; G09G 2320/0626; G11C 11/412; G11C 7/12; G11C 11/401; H01L 27/1225; H01L 27/124
See application file for complete search history.

(56) References Cited

U.S. PATENT DOCUMENTS

| | | | |
|---|---|---|---|
| 5,165,075 | A | 11/1992 | Hiroki et al. |
| 5,349,366 | A | 9/1994 | Yamazaki et al. |
| 6,127,702 | A | 10/2000 | Yamazaki et al. |
| 7,339,235 | B1 | 3/2008 | Yamazaki et al. |
| 7,791,074 | B2 | 9/2010 | Iwasaki |
| 7,859,510 | B2 | 12/2010 | Umezaki |
| 8,400,817 | B2 | 3/2013 | Yamazaki et al. |
| 8,411,480 | B2 | 4/2013 | Nagatsuka et al. |
| 8,472,231 | B2 | 6/2013 | Takemura |
| 8,634,228 | B2 | 1/2014 | Matsuzaki et al. |
| 9,508,276 | B2 | 11/2016 | Hirakata et al. |
| 2004/0125681 | A1 | 7/2004 | Yamaoka et al. |
| 2005/0047266 | A1 | 3/2005 | Shionoiri et al. |
| 2006/0114210 | A1 | 6/2006 | Chen et al. |
| 2007/0008776 | A1 | 1/2007 | Scheuerlein |
| 2008/0037358 | A1 | 2/2008 | Yabuuchi et al. |
| 2008/0149984 | A1 | 6/2008 | Chang et al. |
| 2008/0186266 | A1 | 8/2008 | Takahashi |
| 2009/0002590 | A1 | 1/2009 | Kimura |
| 2009/0045397 | A1 | 2/2009 | Iwasaki |
| 2010/0097838 | A1 | 4/2010 | Tanaka et al. |
| 2010/0148171 | A1 | 6/2010 | Hayashi et al. |
| 2010/0193785 | A1 | 8/2010 | Kimura |
| 2010/0203673 | A1 | 8/2010 | Hayashi et al. |
| 2010/0254179 | A1 | 10/2010 | Kim |
| 2010/0276689 | A1 | 11/2010 | Iwasaki |
| 2010/0279462 | A1 | 11/2010 | Iwasaki |
| 2011/0089417 | A1 | 4/2011 | Yamazaki et al. |
| 2011/0101351 | A1 | 5/2011 | Yamazaki |
| 2011/0121286 | A1 | 5/2011 | Yamazaki et al. |
| 2011/0128777 | A1 | 6/2011 | Yamazaki et al. |
| 2011/0157254 | A1 | 6/2011 | Yamazaki et al. |
| 2011/0176377 | A1* | 7/2011 | Koyama ............ G11C 16/0425 365/200 |
| 2011/0249487 | A1 | 10/2011 | Saito et al. |
| 2012/0033488 | A1 | 2/2012 | Nagatsuka et al. |
| 2014/0167041 | A1 | 6/2014 | Yamazaki et al. |
| 2015/0034948 | A1* | 2/2015 | Takahashi ............ G11C 27/024 257/43 |
| 2017/0031471 | A1* | 2/2017 | Yamazaki ........... H01L 27/3232 |
| 2017/0221429 | A1 | 8/2017 | Kobayashi et al. |
| 2017/0337866 | A1 | 11/2017 | Ikeda et al. |
| 2018/0174647 | A1 | 6/2018 | Takahashi et al. |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

* cited by examiner

FIG. 15A
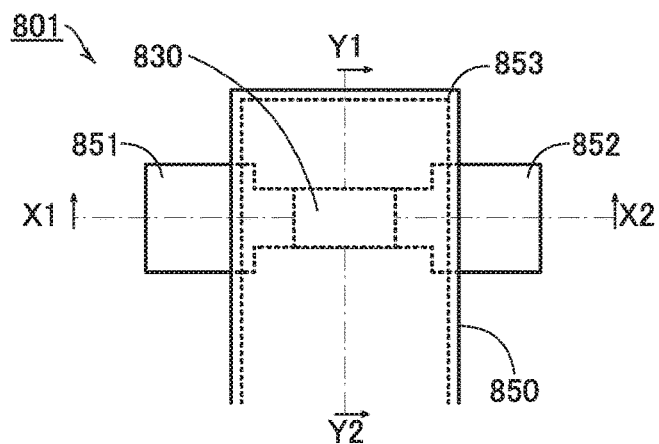
FIG. 15B
FIG. 15C
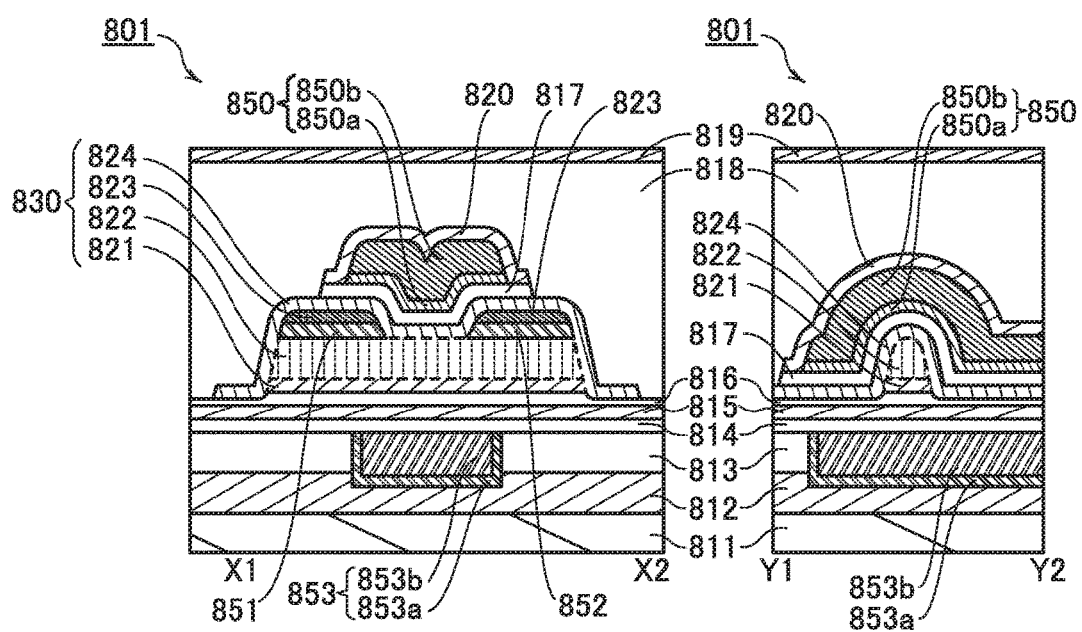

SEMICONDUCTOR DEVICE, MEMORY DEVICE, AND DISPLAY SYSTEM

BACKGROUND OF THE INVENTION

1. Field of the Invention

One embodiment of the present invention relates to a semiconductor device, a memory device, and a display system.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

In recent years, electronic components such as central processing units (CPUs), memory devices, and sensors have been used in various electronic devices such as personal computers, smart phones, and digital cameras.

Patent Document 1 describes a memory device that includes a transistor using an oxide semiconductor and a transistor using single crystal silicon. According to Patent Document 1, the transistor using an oxide semiconductor has an extremely low off-state current.

REFERENCE

Patent Document

[Patent Document 1] Japanese Published Patent Application No. 2012-256400

SUMMARY OF THE INVENTION

An object of one embodiment of the present invention is to provide a novel semiconductor device. Another object of one embodiment of the present invention is to provide a highly reliable semiconductor device. Another object of one embodiment of the present invention is to provide a semiconductor device with low power consumption. Another object of one embodiment of the present invention is to provide a semiconductor device which includes a memory cell capable of holding both a positive potential and a negative potential. Another object of one embodiment of the present invention is to provide a semiconductor device which includes a memory cell capable of controlling the on/off state of a switch for writing data using the potential of a potential hold portion. Another object of one embodiment of the present invention is to provide a semiconductor device which includes a memory cell capable of controlling the potential of a potential hold portion using a plurality of capacitors.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

A semiconductor device of one embodiment of the present invention includes a first transistor, a second transistor, a first capacitor, a third transistor, a fourth transistor, and a second capacitor. A gate of the first transistor is electrically connected to one of a source and a drain of the third transistor, a gate of the fourth transistor, and one electrode of the second capacitor. A gate of the third transistor is electrically connected to one of a source and a drain of the first transistor, a gate of the second transistor, and one electrode of the first capacitor. The other of the source and the drain of the first transistor is electrically connected to a first wiring. One of a source and a drain of the second transistor is electrically connected to a second wiring. The other of the source and the drain of the second transistor is electrically connected to a third wiring. The other electrode of the first capacitor is electrically connected to a fourth wiring. The other of the source and the drain of the third transistor is electrically connected to a fifth wiring. One of a source and a drain of the fourth transistor is electrically connected to a sixth wiring. The other of the source and the drain of the fourth transistor is electrically connected to a seventh wiring. The other electrode of the second capacitor is electrically connected to an eighth wiring.

In addition, the semiconductor device of one embodiment of the present invention may have a function of holding a positive potential and a negative potential in each of a node electrically connected to the one of the source and the drain of the first transistor and a node electrically connected to the one of the source and the drain of the third transistor.

In addition, the semiconductor device of one embodiment of the present invention may have a function of controlling the potential of the node electrically connected to the one of the source and the drain of the first transistor by controlling the potential of the second wiring or the potential of the fourth wiring and controlling the potential of the node electrically connected to the one of the source and the drain of the third transistor by controlling the potential of the sixth wiring or the potential of the eighth wiring.

In the semiconductor device of one embodiment of the present invention, the first transistor and the third transistor may each contain a metal oxide in a channel formation region.

In addition, a memory device of one embodiment of the present invention includes the above semiconductor device, a first driver circuit, a second driver circuit, and a third driver circuit. The first driver circuit has a function of controlling the potential of the first wiring, the potential of the second wiring, the potential of the fifth wiring, and the potential of the sixth wiring. The second driver circuit has a function of controlling the potential of the third wiring and the potential of the seventh wiring. The third driver circuit has a function of controlling the potential of the fourth wiring and the potential of the eighth wiring.

A display system of one embodiment of the present invention includes a control circuit, which includes a frame memory including the above memory device or the above semiconductor device, an image processing portion, and a driver circuit, and a display portion. The frame memory has a function of storing image data. The image processing portion has a function of performing image processing on the image data input from the frame memory to generate a video signal. The driver circuit has a function of outputting the video signal input from the image processing portion to the display portion.

In the display system of one embodiment of the present invention, the display portion may include a first display unit and a second display unit. The first display unit may include a reflective liquid crystal element and the second display unit may include a light-emitting element.

According to one embodiment of the present invention, a novel semiconductor device can be provided. According to another embodiment of the present invention, a highly reliable semiconductor device can be provided. According to another embodiment of the present invention, a semiconductor device with low power consumption can be provided. According to another embodiment of the present invention, a semiconductor device which includes a memory cell capable of holding both a positive potential and a negative potential can be provided. According to another embodiment of the present invention, a semiconductor device which includes a memory cell capable of controlling the on/off state of a switch for writing data using the potential of a potential hold portion can be provided. According to another embodiment of the present invention, a semiconductor device which includes a memory cell capable of controlling the potential of a potential hold portion using a plurality of capacitors can be provided.

Note that the description of these effects does not preclude the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:
FIGS. 10A, 10B1, and 10B2 illustrate configuration examples of a display device;
FIGS. 15A to 15C illustrate a structure example of a transistor.

DETAILED DESCRIPTION OF THE INVENTION

Figure 1A:
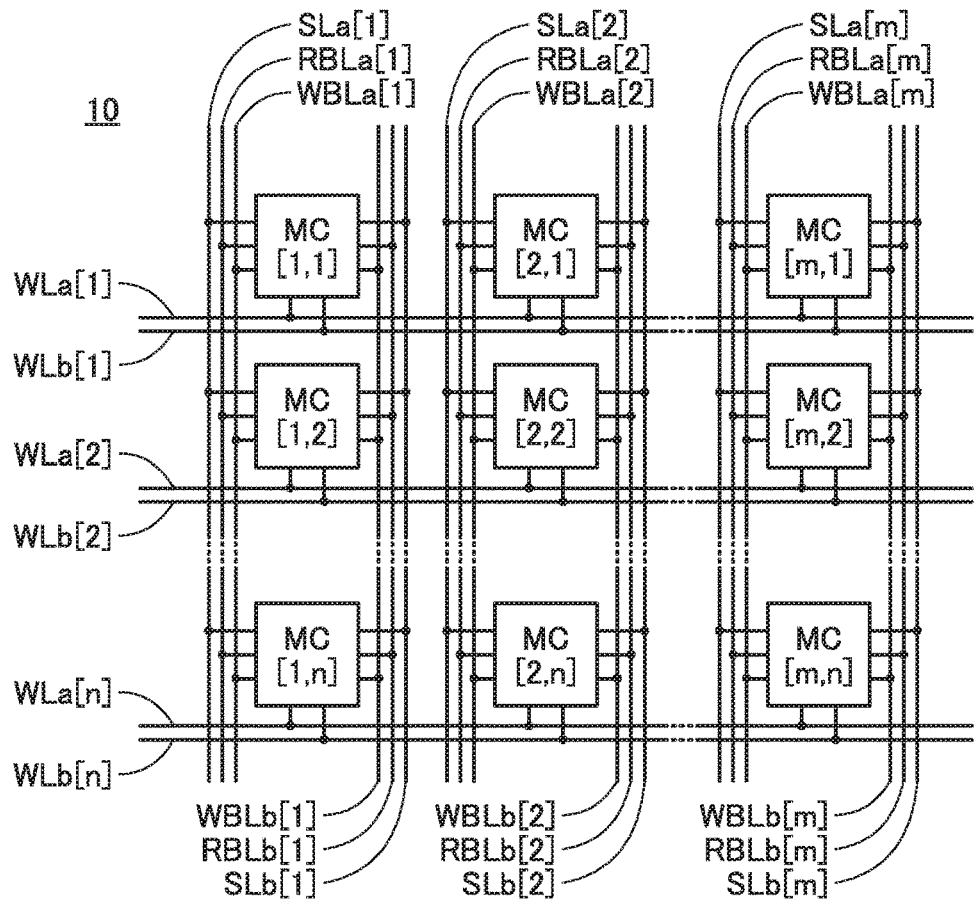
FIGS. 1A and 1B illustrate a configuration example of a semiconductor device and a configuration example of a memory cell.

Embodiments of the present invention will be described below in detail with reference to the accompanying drawings. Note that the present invention is not limited to the description of embodiments below and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, various devices such as semiconductor devices, memory devices, display devices, imaging devices, and radio frequency (RF) tags. The display devices include, in its category, liquid crystal display devices, light-emitting devices having pixels each provided with a light-emitting element typified by an organic light-emitting element, electronic paper, digital micromirror devices (DMDs), plasma display panels (PDPs), field emission displays (FEDs), and the like.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, a CAC-OS or a CAC-metal oxide can be called a matrix composite or a metal matrix composite.

Furthermore, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

Examples of the case where X and Y are electrically connected include the case where one or more elements that allows an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

Examples of the case where X and Y are functionally connected include the case where one or more circuits that allows functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit interposed therebetween), X and Y are functionally connected (i.e., the case where X and Y are functionally connected with another circuit interposed therebetween), and X and Y are directly connected (i.e., the case where X and Y are connected without another element or another circuit interposed therebetween). That is, in this specification and the like, the explicit description "X and Y are electrically connected" is the same as the description "X and Y are connected".

Note that components denoted by the same reference numerals in different drawings represent the same components, unless otherwise specified.

Even when independent components are electrically connected to each other in the drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device and a memory device of one embodiment of the present invention are described.

<Configuration Example of Semiconductor Device>

FIG. 1A illustrates a configuration example of a semiconductor device 10. The semiconductor device 10 includes a plurality of memory cells MC. Each of the memory cells MC is a circuit having a function of storing data. FIG. 1A illustrates a configuration example in which the semiconductor device 10 includes the memory cells MC arranged in m columns and n rows. Hereinafter, the memory cell MC in the x-th column and the y-th row (x is an integer more than or equal to 1 and less than or equal to m, and y is an integer more than or equal to 1 and less than or equal to n) is referred to as a memory cell MC[x,y]. Since the memory cells MC are provided in the semiconductor device 10, the semiconductor device 10 can be used as a memory cell array of a memory device.

To the memory cells MC, a plurality of wirings WL (WLa and WLb), a plurality of wirings SL (SLa and SLb), a plurality of wirings RBL (RBLa and RBLb), and a plurality of wirings WBL (WBLa and WBLb) are connected. The wirings WL have a function of supplying potentials for writing, reading, erasing, and holding data to the memory cells MC in a predetermined row. The wirings SL, RBL, and WBL each have a function of supplying potentials for writing, reading, erasing, and holding data to the memory cells MC in a predetermined column. In addition, the wirings RBL have a function of transmitting potentials (hereinafter, also referred to as a reading potential) corresponding to data stored in the memory cells MC and the wirings WBL have a function of transmitting potentials (hereinafter, also referred to as a writing potential) corresponding to data written to the memory cells MC. Note that the wirings WLa, WLb, SLa, SLb, RBLa, RBLb, WBLa, and WBLb, which are connected to the memory cell MC[x,y], are referred to as wirings WLa[y], WLb[y], SLa[x], SLb[x], RBLa[x], RBLb[x], WBLa[x], and WBLb[x], respectively.

FIG. 1A illustrates a configuration example in which the wirings WLa and WLb are shared by the memory cells MC in the same row, and the wirings SLa, SLb, RBLa, RBLb, WBLa, and WBLb are shared by the memory cells MC in the same column. Each of these wirings may be provided separately for each of the memory cells MC.

The memory cell MC can be formed of a transistor and a capacitor. A transistor containing a metal oxide in a channel formation region (hereinafter, also referred to as an OS transistor) is preferably used in the memory cell MC. A metal oxide has a larger energy gap and a lower minority carrier density than a semiconductor such as silicon; therefore, the off-state current of a transistor using such a metal oxide is extremely low. Accordingly, when an OS transistor is used in the memory cell MC, the potential held in the memory cell MC can be held for a long period as compared to the case where a transistor containing silicon in its channel formation region (hereinafter, also referred to as a Si transistor) is used. Consequently, refresh operation in which writing is performed again at predetermined intervals becomes unnecessary or the frequency of the refresh operation can be extremely low. Moreover, even in a period in which the supply of a signal to the memory cell MC is stopped, data can be held for a long period. Thus, power consumption of the semiconductor device 10 can be reduced.

Figure 1B:
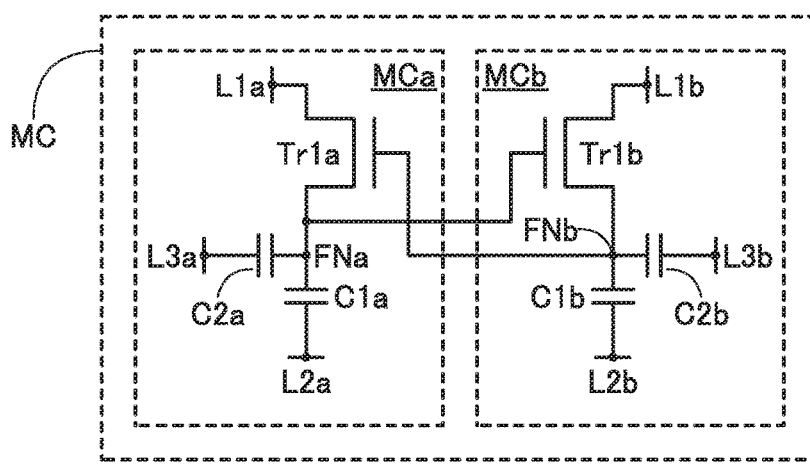

FIG. 1B illustrates part of a configuration of the memory cell MC. In one embodiment of the present invention, the memory cell MC includes a circuit MCa and a circuit MCb. The circuits MCa and MCb each have a function of storing data. The circuit MCa includes a transistor Tr1a, a capacitor C1a, and a capacitor C2a. The circuit MCb includes a transistor Tr1b, a capacitor C1b, and a capacitor C2b.

One of a source and a drain of the transistor Tr1a is connected to one electrode of the capacitor C1a and one electrode of the capacitor C2a. The other of the source and the drain of the transistor Tr1a is connected to a wiring L1a. The other electrode of the capacitor C1a is connected to a wiring L2a and the other electrode of the capacitor C2a is connected to a wiring L3a. A predetermined potential is supplied to each of the wirings L1a to L3a. Here, a node to which one of the source and the drain of the transistor Tr1a, the one electrode of the capacitor C1a, and the one electrode of the capacitor C2a are connected is referred to as a node FNa. The node FNa functions as a potential hold portion of the memory cell MC. The circuit configuration of the circuit MCb is similar to that of the circuit MCa.

The transistors Tr1a and Tr1b each function as a switch for writing data. The wiring L1a and a wiring L1b each have a function of transmitting a writing potential. When the transistor Tr1a is turned on, the potential of the wiring L1a is supplied to the node FNa through the transistor Tr1a. In this way, data is written to the circuit MCa. After that, when the transistor Tr1a is turned off, the node FNa is brought into a floating state, whereby the data is held. In the circuit MCb, data is written and held in a manner similar to the above.

As each of the transistors Tr1a and Tr1b which functions as a switch for writing data, an OS transistor is preferably used. As a result, in an off-state period of each of the transistors Tr1a and Tr1b, the potentials of the node FNa and a node FNb can be held for an extremely long period and the power consumption of the memory cell MC can be reduced.

The off-state current of an OS transistor normalized by channel width can be lower than or equal to $10 \times 10^{-21}$ A/μm (10 zA/μm) with a source-drain voltage of 10 V at room temperature (approximately 25° C.). The off-state current of the OS transistor used as each of the transistors Tr1a and Tr1b is preferably lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the off-state current is preferably lower than or equal to $1 \times 10^{-15}$ A, lower than or equal to $1 \times 10^{-18}$ A, or lower than or equal to $1 \times 10^{-21}$ A at 85° C.

A channel formation region of the OS transistor is preferably formed using a metal oxide containing at least one of indium (In) and zinc (Zn). Typical examples of such a metal oxide include an In oxide, a Zn oxide, an In—Zn oxide, and an In-M-Zn oxide (the element M is Al, Ti, Ga, Y, Zr, La, Ce, Nd, or Hf). A reduction in impurities serving as electron donors, such as hydrogen, and a reduction in oxygen vacancies can make a metal oxide i-type (intrinsic) or substantially i-type. Such a metal oxide can be referred to as a highly purified metal oxide. The carrier density of a metal oxide can be, for example, lower than $8 \times 10^{15}$ cm$^{-3}$, preferably lower than $1 \times 10^{11}$ cm$^{-3}$, further preferably lower than $1 \times 10^{10}$ cm$^{-3}$ and higher than or equal to $1 \times 10^{-9}$ cm$^{-3}$.

A metal oxide has a large energy gap and in which electrons are unlikely to be excited and the effective mass of a hole is large. Accordingly, an avalanche breakdown and the like are less likely to occur in some cases in an OS transistor than in a Si transistor. Since hot-carrier degradation or the like due to the avalanche breakdown is inhibited, the OS transistor has high drain breakdown voltage and can be driven at high drain voltage. Thus, when the OS transistor is used as each of the transistors Tr1a and Tr1b, the range of potentials to be held in the nodes FNa and FNb can be widened.

Note that each of the transistors Tr1a and Tr1b is not necessarily the OS transistor. For example, a transistor whose channel formation region is formed in part of a substrate containing a single-crystal semiconductor other than a metal oxide can be used. Examples of such a substrate include a single-crystal silicon substrate and a single-crystal germanium substrate. In addition, a transistor whose channel formation region is formed in a film containing a semiconductor material other than a metal oxide can also be used as each of the transistors Tr1a and Tr1b. For example, a transistor in which an amorphous silicon film, a microcrystalline silicon film, a polycrystalline silicon film, a single-crystal silicon film, an amorphous germanium film, a microcrystalline germanium film, a polycrystalline germanium film, or a single-crystal germanium film is used for a semiconductor layer can be used.

Replaced by the capacitor included in the memory cell MC, a parasitic capacitance or capacitance between a gate and the source or the drain of the transistor can be used. Three or more capacitors can be connected to a node FN.

Here, in one embodiment of the present invention, a gate of the transistor Tr1a and a gate of the transistor Tr1b are connected to the node FNb and the node FNa, respectively. In this way, the on/off states of the transistors Tr1a and Tr1b can be controlled using the potentials of the nodes FNa and FNb.

In one embodiment of the present invention, the node FNa is connected to the wiring L2a through the capacitor C1a and connected to the wiring L3a through the capacitor C2a. Thus, the potential of the node FNa can be controlled by changing the potential of the wiring L2a by utilizing capacitive coupling of the capacitor C1a. Moreover, the potential of the node FNa can be controlled by changing the potential of the wiring L3a by utilizing capacitive coupling of the capacitor C2a. In this manner, the potential of the node FNa can be controlled using a plurality of capacitors. The potential of the node FNb can be controlled using a plurality of capacitors, in a similar manner.

When one of a positive potential and a negative potential is held in the node FNa for a long period, for example, deterioration of the transistor Tr1a can occur. A change in the characteristics of the transistor Tr1a due to the deterioration may interfere reading, writing, holding, or the like of data in the circuit MCa. However, in one embodiment of the present invention, the potentials of the gate and the source or the drain of the transistor Tr1a can be controlled by controlling the potentials of the nodes FNa and FNb, whereby both a positive potential and a negative potential can be supplied to and held in the node FNa. Moreover, since the potential of the node FNa can be controlled using a plurality of capacitors, the potential of the node FNa can be controlled freely depending on the data stored in the memory cell MC; thus, reading, writing, and holding operations of data can be performed accurately. The same applies to the node FNb.

By applying the configuration in FIG. 1B to the memory cell MC, the polarity of the potentials of the nodes FNa and FNb can be switched so that the state where one of a positive potential and a negative potential is held in the node FNa or the node FNb for a long period can be avoided. With the use of such a memory cell MC, deterioration and a change in the characteristics of the transistors Tr1a and Tr1b can be prevented and the reliability of the semiconductor device 10 can be increased. A specific configuration example and a specific operation example of the memory cell MC with the above configuration are described below.

<Configuration Example of Memory Cell>

Figure 2:
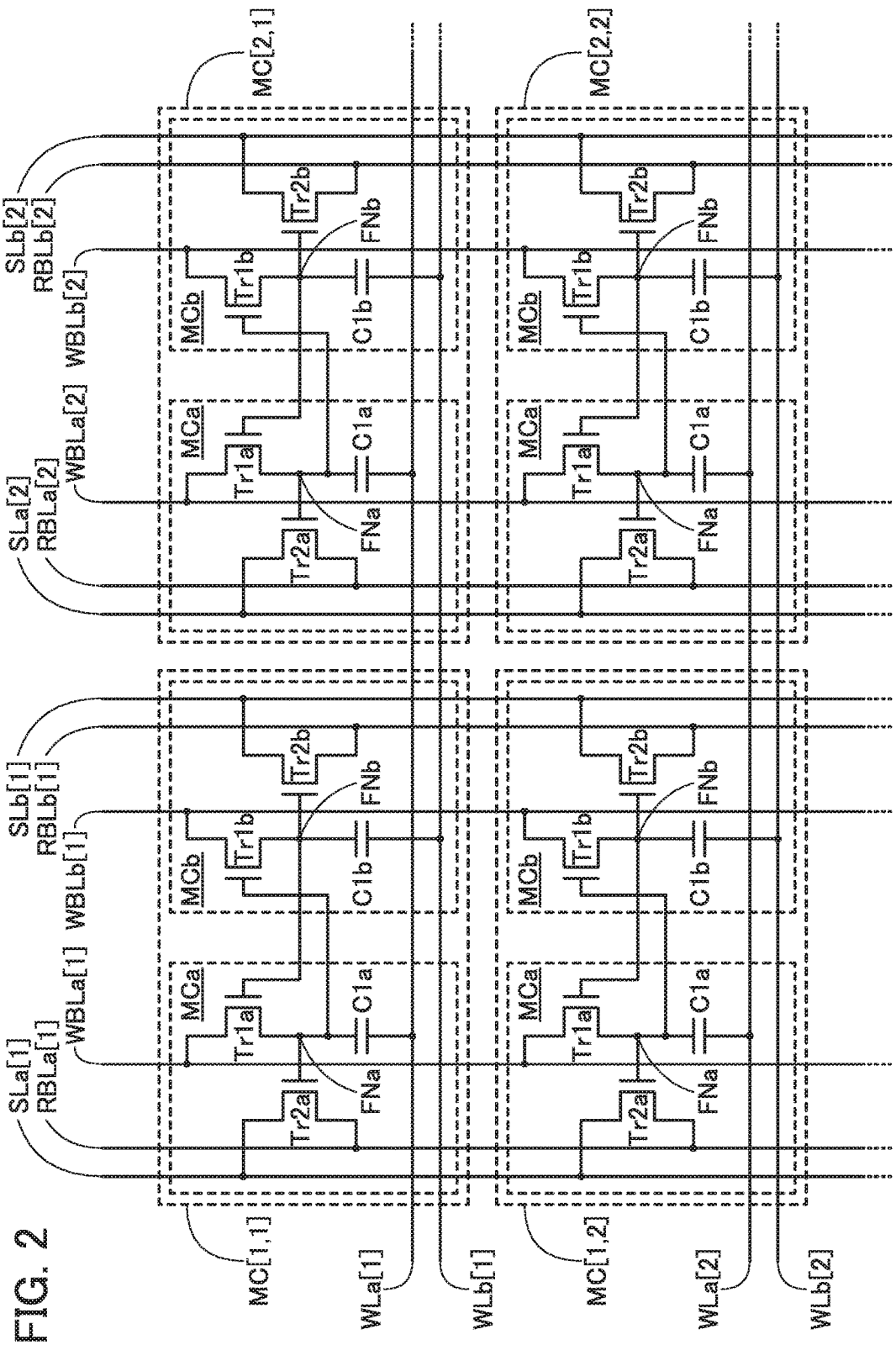
FIG. 2 illustrates a configuration example of a memory cell.

FIG. 2 illustrates a specific configuration example of the memory cell MC. Although an example where the memory cells MC[1,1], MC[2,1], MC[1,2], and MC[2,2] are provided is described as a typical example in FIG. 2, a similar configuration can also be applied to the other memory cells MC.

The memory cells MC[1,1], MC[2,1], MC[1,2], and MC[2,2] each include the circuit MCa and the circuit MCb. The circuit MCa includes the transistor Tr1a, a transistor Tr2a, and the capacitor C1a. The circuit MCb includes the transistor Tr1b, a transistor Tr2b, and the capacitor C1b.

The gate of the transistor Tr1a is connected to the node FNb. One of the source and the drain of the transistor Tr1a is connected to a gate of the transistor Tr2a and the one electrode of the capacitor C1a. The other of the source and the drain of the transistor Tr1a is connected to the wiring WBLa. One of a source and a drain of the transistor Tr2a is connected to the wiring RBLa and the other of the source and the drain of the transistor Tr2a is connected to the wiring SLa. The other electrode of the capacitor C1a is connected to the wiring WLa. The capacitance formed between the gate and one of the source and the drain of the transistor Tr2a corresponds to the capacitor C2a in FIG. 1B.

The gate of the transistor Tr1b is connected to the node FNa. One of a source and a drain of the transistor Tr1b is connected to a gate of the transistor Tr2b and one electrode of the capacitor C1b. The other of the source and the drain of the transistor Tr1b is connected to the wiring WBLb. One of a source and a drain of the transistor Tr2b is connected to the wiring RBLb and the other of the source and the drain of the transistor Tr2b is connected to the wiring SLb. The other electrode of the capacitor C1b is connected to the wiring WLb. The capacitance formed between the gate and one of the source and the drain of the transistor Tr2b corresponds to the capacitor C2b in FIG. 1B.

Examples of transistors that can be used as the transistors Tr2a and Tr2b are similar to those that can be used as the transistors Tr1a and Tr1b.

FIG. 2 illustrates a configuration example in which the wirings WLa and WLb are shared by the memory cells MC in the same row (here, the memory cells MC[1,1] and MC[2,1], and the memory cells MC[1,2] and MC[2,2]), and the wirings SLa, SLb, RBLa, RBLb, WBLa, and WBLb are shared by the memory cells MC in the same column (here, the memory cells MC[1,1] and MC[1,2], and the memory cells MC[2,1] and MC[2,2]). Each of these wirings may be provided separately for each of the memory cells MC.

The gate of the transistor Tr1a is connected to the node FNb and the gate of the transistor Tr1b is connected to the node FNa. In this way, the on/off state of the transistor Tr1a can be controlled using the potential of the node FNb and the on/off state of the transistor Tr1b can be controlled using the potential of the node FNa.

The node FNa is connected to the wiring WLa through the capacitor C1a and connected to the wiring RBLa through the capacitance formed between the gate and one of the source and the drain of the transistor Tr2a. Accordingly, the potential of the node FNa can be controlled by controlling the potentials of the wiring WLa and the wiring RBLa. The potential of the node FNb can be controlled by controlling the potentials of the wiring WLb and the wiring RBLb, in a similar manner.

When the above circuit configuration is applied to the memory cell MC, both a positive potential and a negative potential can be supplied to and held in each of the nodes FNa and FNb. Thus, deterioration of the transistors Tr1a and Tr1b can be prevented. A specific operation example of the memory cell MC when both a positive potential and a negative potential are supplied to and held in the nodes FN is described below.

<Operation Example of Memory Cell>

Figure 3:
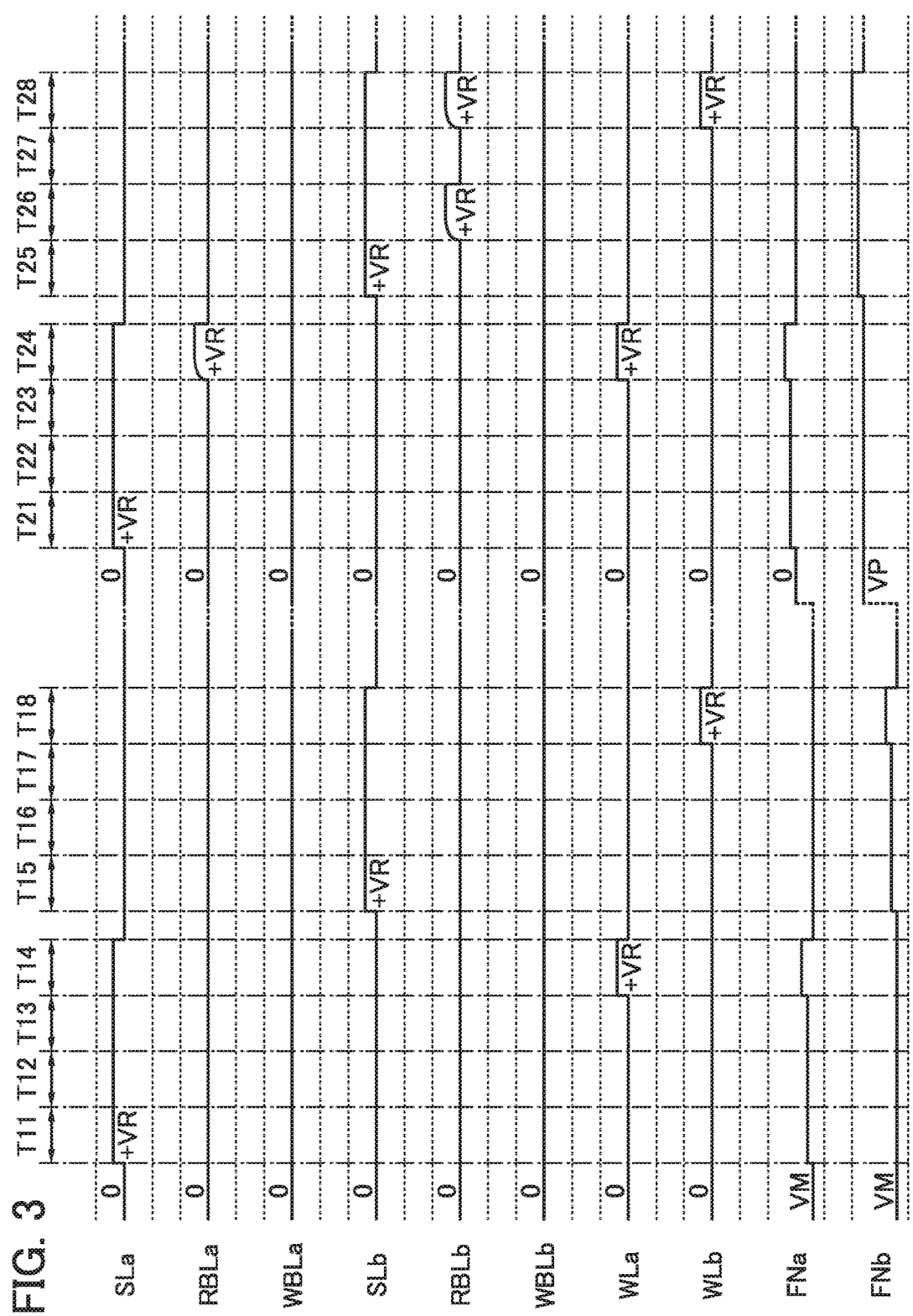
FIG. 3 is a timing chart.
Figure 4:
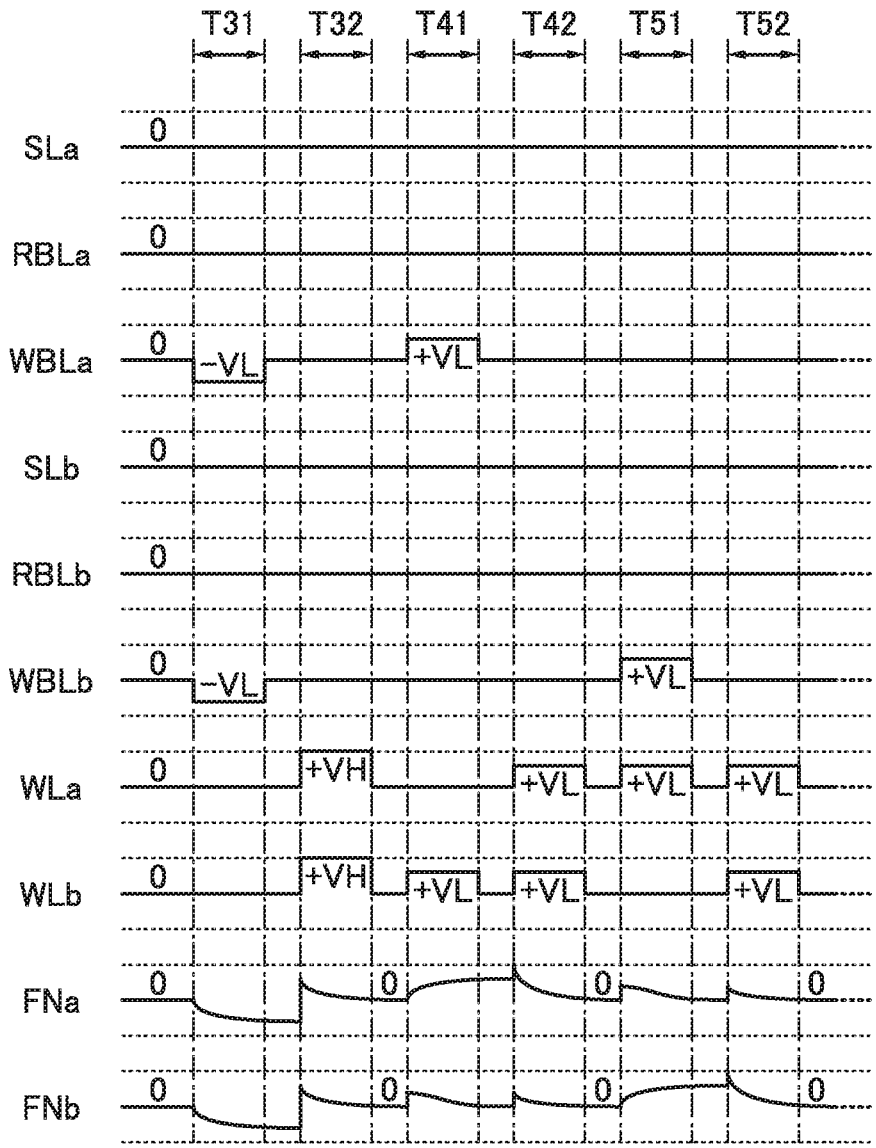
FIG. 4 is a timing chart.

FIG. 3 is a timing chart showing an operation example of reading data from the memory cell MC. FIG. 4 is a timing chart showing an operation example of writing data to the memory cell MC and an operation example of erasing data which is stored in the memory cell MC.

Hereinafter, the case where 2-bit data is stored in each of the memory cells MC in FIG. 2 is described. Specifically, the state where the potentials of the node FNa and the node FNb are negative corresponds to the state where data "11" is stored in the memory cell MC, the state where the potentials of the node FNa and the node FNb are 0 corresponds to the state where data "00" is stored in the memory cell MC, the state where the potential of the node FNa is positive and the potential of the node FNb is 0 corresponds to the state where data "01" is stored in the memory cell MC, and the state where the potential of the node FNa is 0 and the potential of the node FNb is positive corresponds to the state where data "10" is stored in the memory cell MC are described, for example.

The potentials of the nodes FNa and FNb are not limited to three values (positive, 0, and negative) as described above; that is, four or more values of a potential can be held in each of the nodes FNa and FNb. In that case, the amount of data that can be stored in the memory cell MC can be increased. The correspondence between the potentials of the nodes FNa and FNb and the data is not limited to the above and can be determined arbitrarily.

An operation example of the memory cell MC using a potential VR, a potential VL, and a potential VH is described below. The relation among the absolute values of the potentials is 0<VR≤VL<VH.

[Reading Operation]

First, an example of a reading operation of the memory cell MC illustrated in FIG. 2 is described using the timing chart of FIG. 3. In FIG. 3, the data "11" stored in the memory cell MC is read in a period from a period T11 to a period T18 and the data "10" stored in the memory cell MC is read in a period from a period T21 to a period T28. That is, a negative potential (potential VM) is held in each of the node FNa and the node FNb immediately before the period T11, and 0 is held in the node FNa and a positive potential (potential VP) is held in the node FNb immediately before the period T21.

In the period T11, the potential of the wiring RBLa is set to 0 and the potential of the wiring SLa is set to +VR. At this time, the node FNa is in a floating state; thus, when the potential of the wiring SLa increases, the potential of the node FNa also increases by capacitive coupling formed by the transistor Tr2a.

In the period T12, the wiring RBLa is brought into a floating state and the potential of the wiring WLa is set to 0. In the case where the potential of the node FNa is negative (VM) immediately before the period T11, the transistor Tr2a is kept off in the period T12. Thus, the potential of the wiring RBLa is kept at 0.

In the period T14, the wiring RBLa is brought into a floating state and the potential of the wiring WLa is set to +VR. At this time, the node FNa is in a floating state; thus, when the potential of the wiring WLa increases, the potential of the node FNa also increases by capacitive coupling formed by the capacitor C1a. However, in the case where the potential of the node FNa is negative (VM) immediately before the period T11, the transistor Tr2a is kept off also in the period T14. Thus, the potential of the wiring RBLa is kept at 0.

In such a manner, data can be read from the circuit MCa. As described above, when the potential of the wiring RBLa is kept at 0 in the period T12 and the period T14, the potential held in the circuit MCa is negative.

Next, data is read from the circuit MCb in a manner similar to that of the circuit MCa in a period from the period T15 to the period T18. Since the potential of the wiring RBLb is kept at 0 in the period T16 and the period T18, the potential held in the circuit MCb is negative.

Through the above operation, the data "11" stored in the memory cell MC can be read.

In a period from the period T21 to the period T24, data is read from the circuit MCa in a manner similar to that in a period from the period T11 to the period T14. In the case where the potential of the node FNa is 0 immediately before the period T21, the transistor Tr2a is kept off in the period T22. However, in the period T24, the potential of the node FNa increases in accordance with an increase in the potential of the wiring WLa, so that the potential between the gate and the source of the transistor Tr2a becomes higher than the threshold voltage of the transistor Tr2a. Therefore, the transistor Tr2a is turned on and the potential of the wiring RBLa becomes +VR.

As described above, in the case where the potential of the wiring RBLa is kept at 0 in the period T22 and is +VR in the period T24, the potential held in the circuit MCa is 0.

From the period T25 to the period T28, data is read from the circuit MCb in a manner similar to that in the period from the period T15 to the period T18. Here, the potential of the node FNb increases in accordance with an increase in the potential of the wiring SLb in the period T25, so that the potential between the gate and the source of the transistor Tr2b becomes higher than the threshold voltage of the transistor Tr2b in the case where the potential of the node FNb is positive (VP) immediately before the period T25. Therefore, the transistor Tr2b is turned on and the potential of the wiring RBLb becomes +VR. As described above, when the potential of the wiring RBLb is +VR in the period T26, the potential held in the circuit MCb is positive.

Through the above operation, the data "10" stored in the memory cell MC can be read.

In the case where the data "00" is stored in the memory cell MC, both the circuit MCa and the circuit MCb operate like the circuit MCa in the period from the period T21 to the period T24. In the case where the data "01" is stored in the memory cell MC, the circuit MCa operates like the circuit MCb in the period from the period T25 to the period T28 and the circuit MCb operates like the circuit MCa in the period from the period T21 to the period T24. Thus, the data stored in the memory cell MC can be determined using the potentials of the wiring RBLa and the wiring RBLb in any case.

As described above, the potential of the node FN can be controlled by controlling the potentials of the wirings SL and WL, whereby data can be read.

Although the reading operations of the circuit MCa and the circuit MCb are performed in different periods in the example in FIG. 3, the operations can be performed simultaneously. Alternatively, data reading of the memory cells MC in the same row may be performed simultaneously or sequentially.

When data is read from the memory cells MC in one row, a potential at which the transistors Tr1a and Tr1b can be kept off is preferably supplied to each of the memory cells MC in the other rows. For example, when the reading operations of the memory cells MC[1,1] and MC[2,1] in FIG. 2 are performed, the negative potential −VR is preferably applied to each of the wirings WLa[2] and WLb[2] which are connected to the memory cells MC[1,2] and MC[2,2]. Accordingly, an unexpected output of a potential from the memory cells MC which are not selected to the wiring RBL can be prevented.

[Writing Operation and Erasing Operation]

Then, examples of a writing operation and an erasing operation of the memory cell MC illustrated in FIG. 2 are described using the timing chart of FIG. 4. In FIG. 4, the data "11" is written and erased in periods T31 and T32, the data "01" is written and erased in periods T41 and T42, and the data "10" is written and erased in periods T51 and T52.

Immediately before the period T31, 0 is held in each of the node FNa and the node FNb and the data "00" is stored in the memory cell MC.

In the period T31, the potentials of the wirings WBLa and WBLb are set to −VL. Accordingly, the transistors Tr1a and Tr1b are turned on, whereby the potential (negative potential) of the wiring WBLa is supplied to the node FNa through the transistor Tr1a and the potential (negative potential) of the wiring WBLb is supplied to the node FNb through the transistor Tr1b. Thus, the data "11" is written to the memory cell MC. When the potentials of the nodes FNa and FNb become lower than or equal to a certain value, the transistors Tr1a and Tr1b are turned off.

In the period T32, the potentials of the wirings WLa and WLb are set to +VH while the potentials of the wirings WBLa and WBLb are set to 0. As a result, the potentials of the nodes FNa and FNb increase, so that the transistors Tr1a and Tr1b are turned on. Then, the potential (0) of the wiring WBLa is supplied to the node FNa through the transistor Tr1a and the potential (0) of the wiring WBLb is supplied to the node FNb through the transistor Tr1b. Accordingly, the data "11" is erased and the memory cell MC returns to the state where the data "00" is stored.

In the period T41, the potentials of the wirings WBLa and WLb are set to +VL while the potential of the wiring WBLb is set to 0. Accordingly, the potential of the node FNb increases, so that the transistor Tr1a is turned on. Then, the potential (+VL) of the wiring WBLa is supplied to the node FNa through the transistor Tr1a. When the potential of the node FNa becomes higher than or equal to a certain value, the transistor Tr1a is turned off. On the contrary, the potential of the node FNb is kept at 0 after the writing operation. Thus, the data "01" is written to the memory cell MC.

In the period T42, the potentials of the wirings WLa and WLb are set to +VL while the potentials of the wirings WBLa and WBLb are set to 0. Accordingly, the potentials of the nodes FNa and FNb increase, so that the transistors Tr1a and Tr1b are turned on. Then, the potential (0) of the wiring WBLa is supplied to the node FNa through the transistor Tr1a and the potential (0) of the wiring WBLb is supplied to the node FNb through the transistor Tr1b. Accordingly, the data "01" is erased and the memory cell MC returns to the state where the data "00" is stored.

In the period T51, the potentials of the wiring WBLb and the wiring WLa are set to +VL while the potential of the wiring WBLa is set to 0. Accordingly, the potential of the node FNa increases, so that the transistor Tr1b is turned on. Then, the potential (+VL) of the wiring WBLb is supplied to the node FNb through the transistor Tr1b. On the contrary, the potential of the node FNa is kept at 0. Thus, the data "10" is written to the memory cell MC. When the potential of the node FNb becomes higher than or equal to a certain value, the transistor Tr1b is turned off. On the contrary, the potential of the node FNa is kept at 0 after the writing operation. Thus, the data "10" is written to the memory cell MC.

In the period T52, the potentials of the wirings WLa and WLb are set to +VL while the potentials of the wirings WBLa and WBLb are set to 0. Accordingly, the potentials of the nodes FNa and FNb increase, so that the transistors Tr1a and Tr1b are turned on. Then, the potential (0) of the wiring WBLa is supplied to the node FNa through the transistor Tr1a and the potential (0) of the wiring WBLb is supplied to the node FNb through the transistor Tr1b. Accordingly, the data "10" is erased and the memory cell MC returns to the state where the data "00" is stored.

As described above, the potential of the node FN can be controlled by controlling the potentials of the wirings WBL and WL, whereby data can be written and erased. In the operations shown in FIG. 4, different potentials are supplied to the wirings depending on the data stored in the memory cell MC. Therefore, the erasing operation is performed on the basis of the data that is read from the memory cell MC in advance.

When data is written to the memory cells MC in one row, a potential at which the transistors Tr1a and Tr1b can be kept off is preferably supplied to each of the memory cells MC in the other rows. For example, when the writing operations of the memory cells MC[1,1] and MC[2,1] in FIG. 2 are performed, the potential 0 is preferably applied to each of the wirings SLa[2], SLb[2], RBLa[2], and RBLb[2] which are connected to the memory cells MC[2,1] and MC[2,2] and the negative potential −VL is preferably applied to each of the wirings WLa[2] and WLb[2] which are connected to the memory cells MC[1,2] and MC[2,2]. Accordingly, unexpected changes in data in the memory cells MC which are not selected can be prevented.

When data is erased in the memory cells MC in one row, a potential at which the transistors Tr1a and Tr1b can be kept off is preferably supplied to each of the memory cells MC in the other rows. For example, when the erasing operations of the data "11" of the memory cells MC[1,1] and MC[2,1] in FIG. 2 are performed, the potential 0 is preferably applied to each of the wirings SLa[2], SLb[2], RBLa[2], and RBLb[2] which are connected to the memory cells MC[2,1] and MC[2,2], the positive potential +VH is preferably applied to each of the wirings WBLa[2] and WBLb[2] which are connected to the memory cells MC[2,1] and MC[2,2], and the negative potential −VL is preferably applied to each of the wirings WLa[2] and WLb[2] which are connected to the memory cells MC[1,2] and MC[2,2]. When the erasing operations of the data "01" or the data "10" of the memory cells MC[1,1] and MC[2,1] in FIG. 2 are performed, a potential 0 is preferably applied to each of the wirings SLa[2], SLb[2], RBLa[2], and RBLb[2] which are connected to the memory cells MC[2,1] and MC[2,2], the positive potential +VL is preferably applied to each of the wirings WBLa[2] and WBLb[2] which are connected to the memory cells MC[2,1] and MC[2,2], and the negative potential −VL is preferably applied to each of the wirings WLa[2] and WLb[2] which are connected to the memory cells MC[1,2] and MC[2,2]. Accordingly, unexpected changes in data in the memory cells MC which are not selected can be prevented.

[Data Holding]

In the memory cell MC, any of the positive potential, the potential 0, and the negative potential of the node FN can be held.

When the data "11" is stored in the memory cell MC, the potentials of the nodes FNa and FNb are negative. At this time, the potentials of the gates of the transistors Tr1a and Tr1b become also negative; thus, the transistors Tr1a and Tr1b are turned off, and the potentials of the nodes FNa and FNb can be held. As described above, since the memory cell MC includes a configuration in which the gate of the transistor Tr1a and the gate of the transistor Tr1b are connected to the node FNb and the node FNa, respectively, a negative potential can be held in each of the nodes FNa and FNb.

When the data "00" is stored in the memory cell MC, the potentials of the nodes FNa and FNb are 0 and the potential difference between the gate and the source and the potential difference between the source and the drain of each of the transistors Tr1a and Tr1b are 0; thus, the potentials of the nodes FNa and FNb are kept at 0.

When the data "01" is stored in the memory cell MC, the potential of the node FNa is positive and the potential of the node FNb is 0. Therefore, the transistor Tr1a is turned off and the potential of the node FNa can be held. This is similar in the case where the data "10" is stored in the memory cell MC.

Table 1 shows voltage stress applied to the transistors Tr1a and Tr1b when the data "11", "00", "01", or "10" is stored in the memory cell MC. In Table 1, "G-FN" represents the voltage stress (hereinafter, also referred to as gate voltage stress) applied to the gates of the transistors Tr1a and Tr1b with the potentials of the sources or the drains (on the node FNa side or the node FNb side) of the transistors Tr1a and Tr1b used as references. Furthermore, "WBL-FN" represents the voltage stress (hereinafter, also referred to as drain voltage stress) applied to the drains or the sources (on the wiring WBLa side or the wiring WBLb side) of the transistors Tr1a and Tr1b with the potentials of the sources or the drains (on the node FNa side or the node FNb side) of the transistors Tr1a and Tr1b used as references. In addition, "+" and "−" in Table 1 represent positive voltage stress and negative voltage stress, respectively. Note that here, the potentials of the wirings WBLa and WBLb in a data holding period are 0.

TABLE 1

|  |  | "11" | "00" | "01" | "10" |
|---|---|---|---|---|---|
| Tr1a | G-FN | 0 | 0 | − | + |
|  | WBL-FN | + | 0 | − | 0 |
| Tr1b | G-FN | 0 | 0 | + | − |
|  | WBL-FN | + | 0 | 0 | − |

In the case where only one of the positive voltage stress and the negative voltage stress is applied to the transistor, the transistor may deteriorate and the characteristics of the transistor may change. However, as shown in Table 1, both the positive gate voltage stress and the negative gate voltage stress and both the positive drain voltage stress and the negative drain voltage stress are applied to the transistors Tr1a and Tr1b. Thus, application of only one of the positive voltage stress and the negative voltage stress to the transistors Tr1a and Tr1b can be prevented and the deterioration of the transistors Tr1a and Tr1b can be suppressed.

When the positive gate voltage stress is applied to the transistors Tr1a and Tr1b for a long period, for example, ions or particles which have negative charges may be injected into gate insulating films of the transistors Tr1a and Tr1b and deterioration in which the threshold voltages of the transistors Tr1a and Tr1b change may be caused. However, when different data is stored in the memory cell MC and the negative gate voltage stress is applied to the transistors Tr1a and Tr1b, the ions or particles which have negative charges are released from the gate insulating films of the transistors Tr1a and Tr1b; therefore, the threshold voltages can be restored.

When it is assumed that the data "11", "00", "01", and "10" are stored in the memory cell MC substantially equally, it can be seen from Table 1 that the positive stress and the negative stress are equally applied to the transistors Tr1a and Tr1b. Thus, deterioration of the transistors Tr1a and Tr1b can be suppressed more effectively. Note that in the case where a period of holding specific data stored in the memory cell MC is estimated to be long, the data may be intentionally stored in the different memory cell MC, for example, so as to control the voltage stress applied to the transistors Tr1a and Tr1b.

As described above, since the voltage stress applied to the transistors included in the memory cell MC has both of positive and negative values, change and deterioration in the characteristics of the transistors can be suppressed; therefore, the reliability of the semiconductor device 10 can be increased.

<Modification Examples of Memory Cell>

The configuration example of the memory cell MC is not limited to that shown in FIG. 2. FIGS. 5A and 5B and FIGS. 6A and 6B each illustrate another configuration example of the memory cell MC.

Figure 5A:
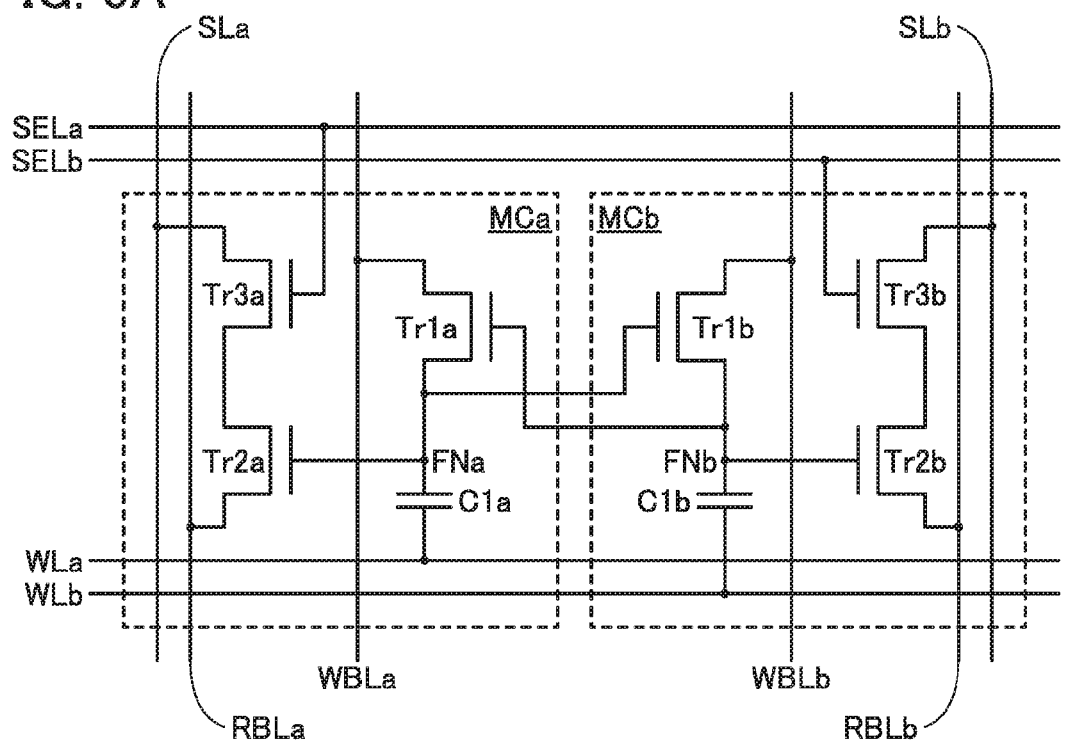
FIGS. 5A and 5B illustrate configuration examples of a memory cell.

The memory cells MC illustrated in FIG. 5A are different from the memory cells MC illustrated in FIG. 2 in that a transistor Tr3a and a transistor Tr3b are included. A gate of the transistor Tr3a is connected to a wiring SELa, one of a source and a drain of the transistor Tr3a is connected to one of the source and the drain of the transistor Tr2a, and the other of the source and the drain of the transistor Tr3a is connected to the wiring SLa. The same applies to the transistor Tr3b. The wiring SELa and a wiring SELb may be the same wiring. Examples of transistors that can be used as the transistors Tr3a and Tr3b are similar to those that can be used as the transistors Tr1a and Tr1b.

With the use of the transistors Tr3a and Tr3b, the timing of output a potential to each of the wiring RBLa and the wiring RBLb can be controlled in a data reading operation. The timing of output the potential can be controlled by controlling the on/off states of the transistors Tr3a and Tr3b using the potentials of the wirings SELa and SELb.

Figure 5B:
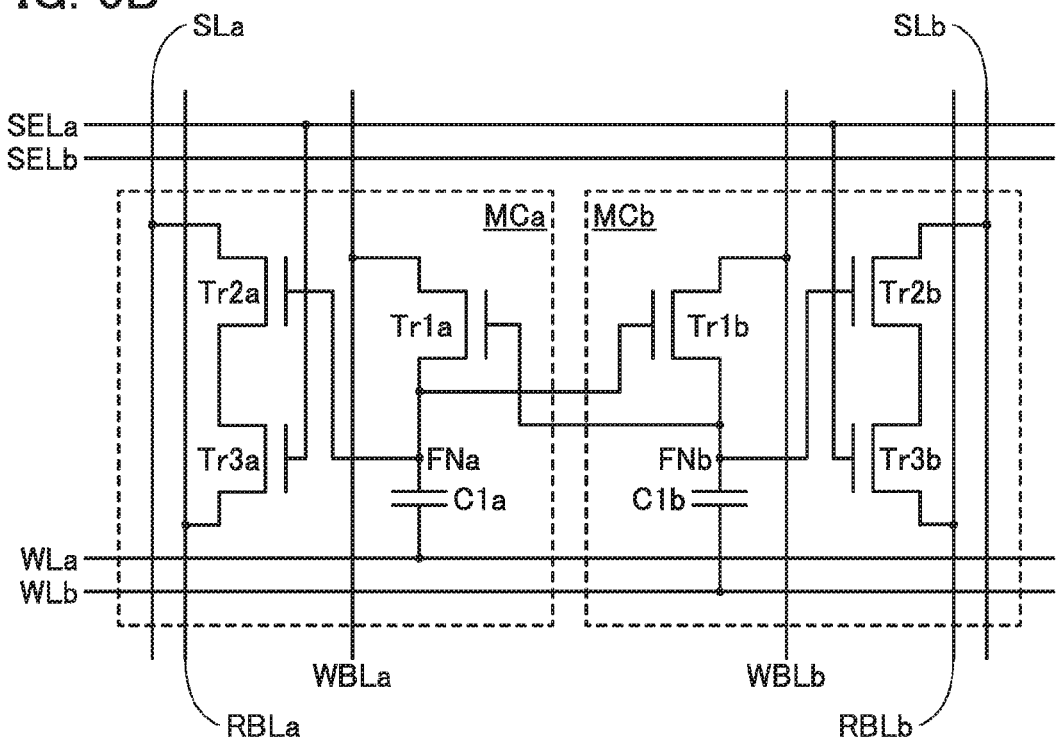

As illustrated in FIG. 5B, the transistor Tr3a may be provided between the transistor Tr2a and the wiring RBLa and the transistor Tr3b may be provided between the transistor Tr2b and the wiring RBLb.

Figure 6A:
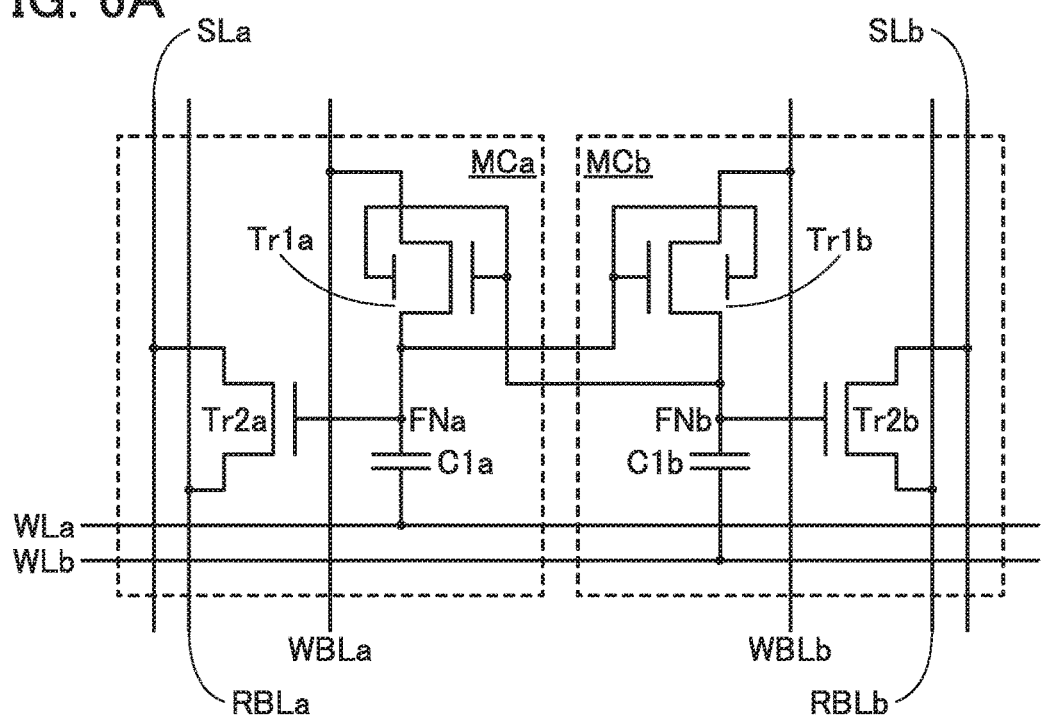
FIGS. 6A and 6B illustrate configuration examples of a memory cell.
Figure 6B:
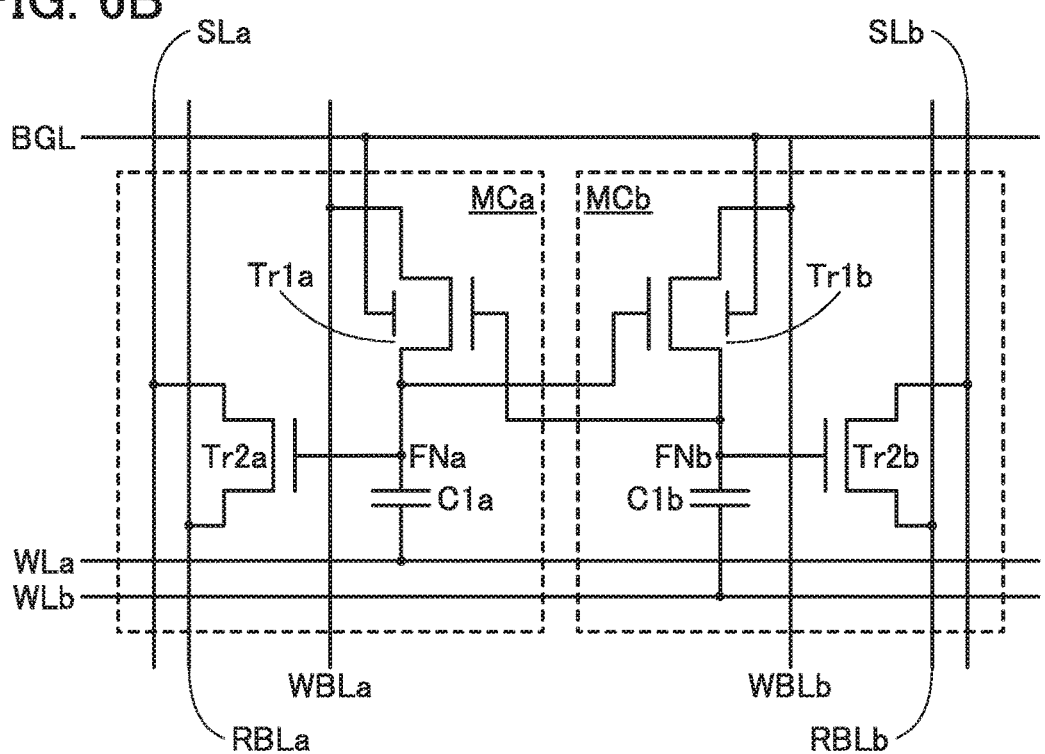

In addition, the transistors Tr1a and Tr1b each may include a pair of gates. FIGS. 6A and 6B illustrate configuration examples in which the transistors Tr1a and Tr1b each include a pair of gate electrodes. Here, an OS transistor is used as each of the transistors Tr1a and Tr1b. Note that when a transistor includes a pair of gates, one gate is referred to as a first gate, a top gate, or simply a gate in some cases, and the other gate is referred to as a second gate or a bottom gate in some cases.

The transistors Tr1a and Tr1b illustrated in FIG. 6A each include a bottom gate which is connected to a top gate. In this case, the potentials of the top gate and the bottom gate are equal.

A bottom gate of each of the transistors Tr1a and Tr1b illustrated in FIG. 6B is connected to a wiring BGL. The wiring BGL has a function of supplying a predetermined potential to the bottom gates. The threshold voltage of each of the transistors Tr1a and Tr1b can be controlled by controlling the potential of the wiring BGL. The potential supplied to the wiring BGL may be either a fixed potential or a varied potential. In the case where a varied potential is supplied to the wiring BGL, by changing the potential of the wiring BGL between a period in which the transistors Tr1a and Tr1b are turned on and a period in which the transistors Tr1a and Tr1b are turned off, for example, the threshold voltage of each of the transistors Tr1a and Tr1b may be changed.

The wiring BGL connected to the transistor Tr1a and the wiring BGL connected to the transistor Tr1b may be separately provided. Moreover, the wiring BGL may be shared by all or some of the memory cells MC included in the semiconductor device 10.

As described above, the on/off states of the transistors Tr1a and Tr1b can be controlled using the potentials of the potential hold portions (the nodes FNa and FNb) in one embodiment of the present invention. In addition, the potential of the potential hold portion can be controlled using a plurality of capacitors in one embodiment of the present invention. Accordingly, the memory cell MC in which both a positive potential and a negative potential can be held in the potential hold portion can be achieved. Therefore, deterioration of the transistors included in the memory cell MC can be prevented and the characteristics of the transistors can be maintained, so that a highly reliable semiconductor device can be provided.

In addition, a use of an OS transistor in the memory cell MC enables one embodiment of the present invention to provide a semiconductor device with low power consumption.

This embodiment can be combined with any of the other embodiments as appropriate.

Embodiment 2

In this embodiment, a configuration example of a memory device in which the semiconductor device 10 described in the above embodiment is used is described.

Figure 7:
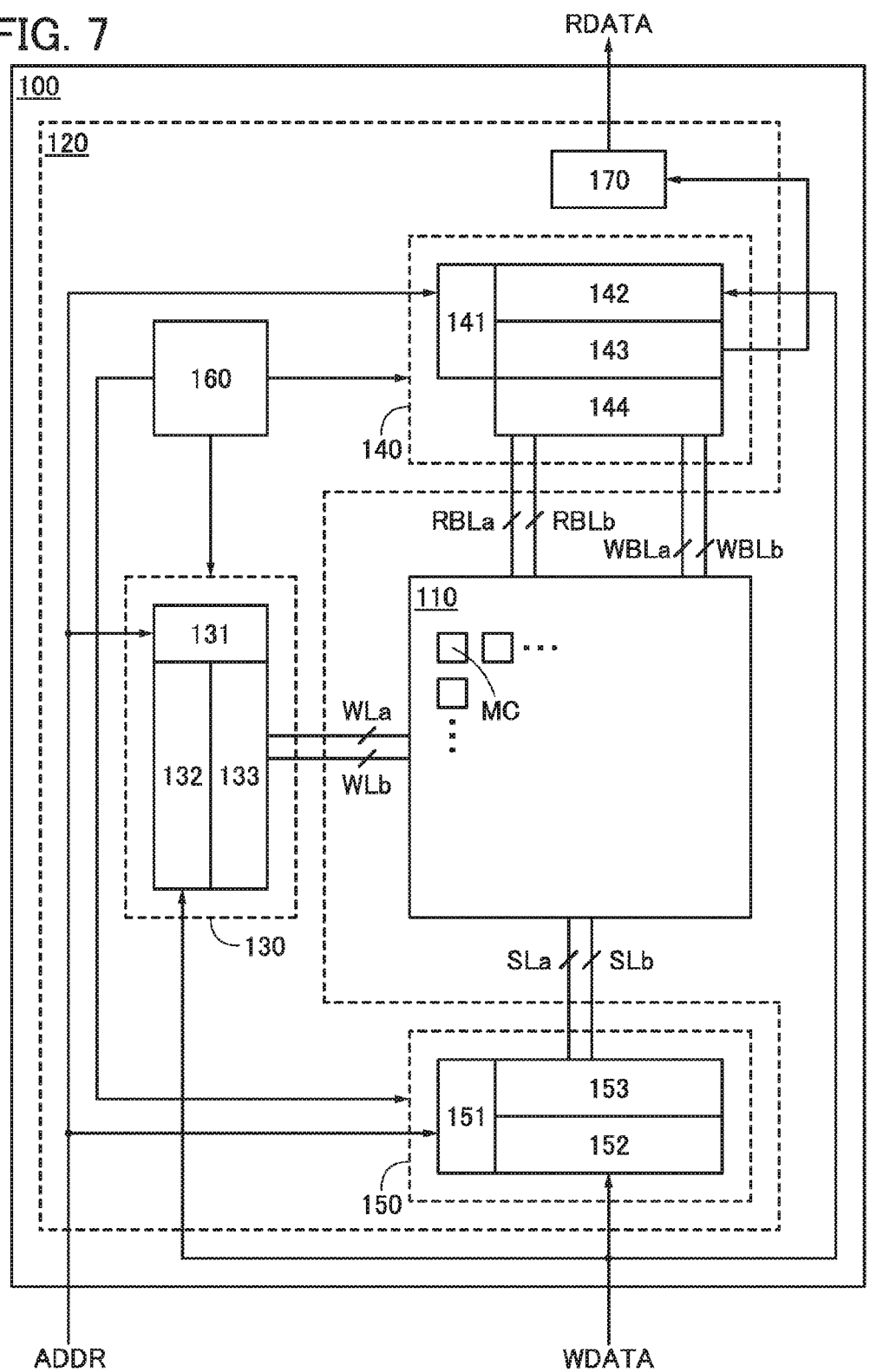
FIG. 7 illustrates a configuration example of a memory device.

FIG. 7 illustrates a configuration example of a memory device 100. The memory device 100 includes a cell array 110 and a driver circuit portion 120.

The cell array 110 includes a plurality of the memory cells MC and has a function of storing data. As the cell array 110, the semiconductor device 10 described in the above embodiment can be used.

The driver circuit portion 120 includes a driver circuit 130, a driver circuit 140, a driver circuit 150, a control circuit 160, and an output circuit 170. The driver circuit 130 has a function of controlling the potentials of the wirings WLa and WLb. The driver circuit 140 has a function of controlling the potentials of the wirings RBLa, RBLb, WBLa, and WBLb. The driver circuit 150 has a function of controlling the potentials of the wirings SLa and SLb.

The driver circuit 130 includes a decoder 131, a row driver 132, and a sense amplifier 133.

The decoder 131 has a function of decoding an address signal ADDR input from the outside and a function of supplying a control signal to the row driver 132 or the sense amplifier 133.

The row driver 132 has a function of selecting the wiring WLa and the wiring WLb which are connected to the memory cells MC in a predetermined row and a function of supplying a potential for writing, reading, or erasing data to each of the wiring WLa and the wiring WLb. The wiring WLa and the wiring WLb are selected based on the control signal input from the decoder 131. A potential which is supplied to each of the wiring WLa and the wiring WLb when data is written is generated using data WDATA input from the outside. The data WDATA corresponds to the data written to the cell array 110.

The sense amplifier 133 has a function of amplifying a potential generated in the row driver 132 and a function of supplying the potential to each of the wiring WLa and the wiring WLb. In the case where there is no need to amplify the potential generated in the row driver 132, the sense amplifier 133 can be omitted.

The driver circuit 140 includes a decoder 141, a column driver 142, a sense amplifier 143, and a precharge circuit 144.

The decoder 141 has a function of decoding an address signal ADDR input from the outside and a function of supplying a control signal to the column driver 142 or the sense amplifier 143.

The column driver 142 has a function of selecting the wiring RBLa and the wiring RBLb and the wiring WBLa and the wiring WBLb which are connected to the memory cells MC in a predetermined column and a function of supplying a potential for writing, reading, or erasing data to each of the wiring RBLa and the wiring RBLb and the wiring WBLa and the wiring WBLb. The wiring RBLa and the wiring RBLb and the wiring WBLa and the wiring WBLb are selected based on the control signal input from the decoder 141. A potential which is supplied to each of the wiring RBLa and the wiring RBLb and the wiring WBLa and the wiring WBLb when data is written is generated using data WDATA input from the outside.

The sense amplifier 143 has a function of amplifying the potential generated in the column driver 142 and a function of supplying the potential to each of the wiring RBLa and the wiring RBLb and the wiring WBLa and the wiring WBLb. In addition, the sense amplifier 143 has a function of amplifying the potential corresponding to the data stored in the cell array 110 and outputting the potential to the output circuit 170. In the case where there is no need to amplify the potential generated in the column driver 142 and the potential output from the cell array 110, the sense amplifier 143 can be omitted.

The precharge circuit 144 has a function of precharging the wirings RBLa and RBLb to predetermined potentials and a function of making the wirings RBLa and RBLb at floating states. The precharge circuit 144 may have a function of precharging the wirings WBLa and WBLb to predetermined potentials and a function of making the wirings WBLa and WBLb at floating states.

The driver circuit 150 includes a decoder 151, a column driver 152, and a sense amplifier 153.

The decoder 151 has a function of decoding an address signal ADDR input from the outside and a function of supplying a control signal to the column driver 152 or the sense amplifier 153.

The column driver 152 has a function of selecting the wiring SLa and the wiring SLb which are connected to the memory cells MC in a predetermined column and a function of supplying a potential for writing, reading, or erasing data to each of the wiring SLa and the wiring SLb. The wiring SLa and the wiring SLb are selected based on the control signal input from the decoder 151. A potential which is supplied to each of the wiring SLa and the wiring SLb when data is written is generated using data WDATA input from the outside.

The sense amplifier 153 has a function of amplifying the potential generated in the column driver 152 and a function of supplying the potential to each of the wiring SLa and the wiring SLb. In the case where there is no need to amplify the potential generated in the column driver 152, the sense amplifier 143 can be omitted.

The control circuit 160 is a logic circuit which has a function of controlling the entire operation of the driver circuit portion 120 and a function of generating signals for controlling the operation of the driver circuit 130, the driver circuit 140, and the driver circuit 150. Specifically, the control circuit 160 has a function of generating control signals by performing logic operation using a signal input from the outside and has a function of supplying the control signals to each of the driver circuit 130, the driver circuit 140, and the driver circuit 150. Examples of the signal input to the control circuit 160 include a chip enable signal, a write enable signal, and a read enable signal.

The output circuit 170 has a function of controlling the output of data read from the cell array 110 to the outside. When data is read, a reading potential is supplied from the cell array 110 to the driver circuit 140. The reading potential is amplified by the sense amplifier 143 and output to the outside as data RDATA through the output circuit 170.

Although FIG. 7 illustrates a configuration example in which the driver circuit 140 having a function of controlling the potentials of the wirings RBL and WBL and the driver circuit 150 having a function of controlling the potentials of the wirings SL are provided separately, the potentials of the wirings RBL, WBL, and SL may be controlled by the same driver circuit. Alternatively, a driver circuit having a function of controlling the potentials of the wirings RBL and a driver circuit having a function of controlling the potentials of the wirings WBL may be provided separately.

This embodiment can be combined with any of the other embodiments as appropriate.

Embodiment 3

In this embodiment, application examples of the semiconductor device or the memory device described in the above embodiments are described.

<Computer>

Figure 8:
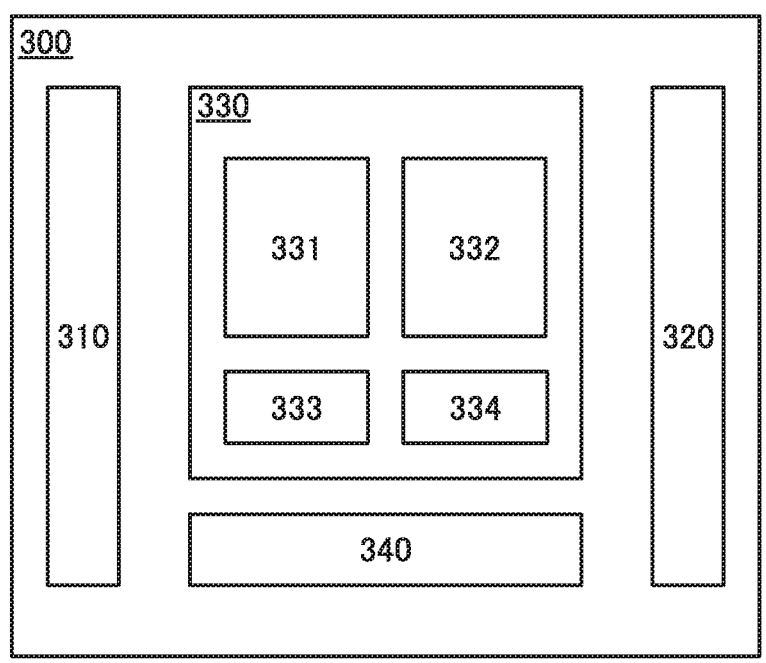
FIG. 8 illustrates a configuration example of a computer.

The semiconductor device 10 or the memory device 100 can be used for a memory device of a computer. FIG. 8 illustrates a configuration example of a computer 300. The computer 300 includes an input device 310, an output device 320, a central processing unit 330, and a main memory device 340.

The central processing unit 330 includes a control circuit 331, an arithmetic circuit 332, a memory device 333, and a memory device 334.

The input device 310 has a function of receiving data from the outside of the computer 300. The output device 320 has a function of outputting data to the outside of the computer 300.

The control circuit 331 has a function of outputting control signals to the input device 310, the output device 320, the main memory device 340, the arithmetic circuit 332, the memory device 333, and the memory device 334. The arithmetic circuit 332 has a function of performing a calculation using input data. The memory device 333 can hold data used for a calculation in the arithmetic circuit 332 and thus functions as a register. The memory device 334 can store part of data in the main memory device 340 and functions as a cache memory.

Note that the memory device 334 is provided in the central processing unit 330 in FIG. 8 but may be provided outside the central processing unit 330 or both inside and outside the central processing unit 330. Alternatively, a plurality of the memory devices 334 may be provided both inside and outside the central processing unit 330. In the case where the memory devices 334 are provided both inside and outside the central processing unit 330, the memory device 334 provided inside the central processing unit 330 can be used as a primary cache, and the memory device 334 provided outside the central processing unit 330 can be used as a secondary cache.

The memory devices 333 and 334 can operate at higher speed than the main memory device 340. The capacity of the main memory device 340 can be larger than that of the memory device 334, and the capacity of the memory device 334 can be larger than that of the memory device 333.

By provision of the memory device 334 functioning as a cache memory, the processing speed of the central processing unit 330 can be improved.

The semiconductor device 10 or the memory device 100 in the above embodiment is preferably used for the memory device 334 or the main memory device 340. Thus, a computer with high reliability can be achieved.

<Display System>

Figure 9:
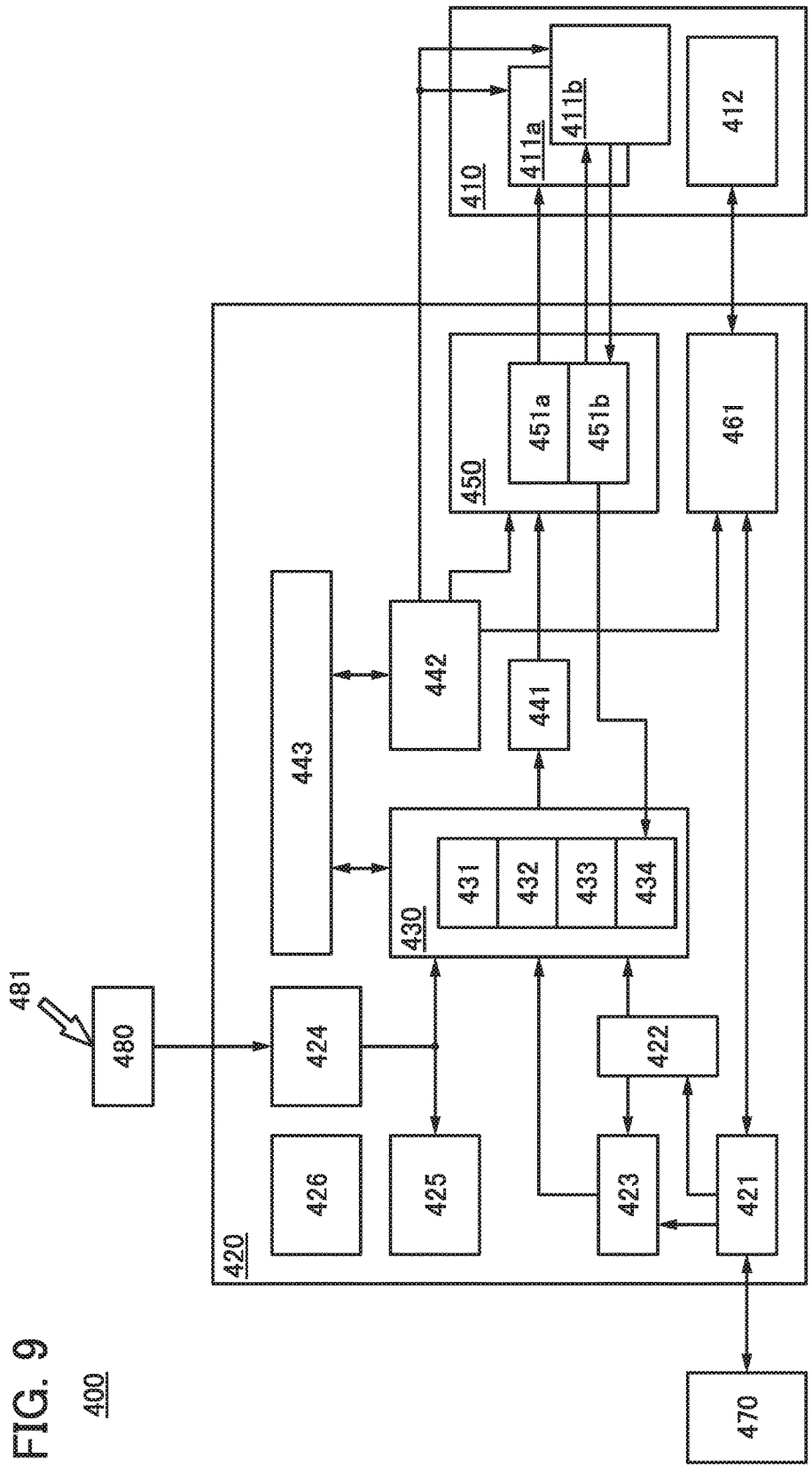
FIG. 9 illustrates a configuration example of a display system.

The semiconductor device 10 or the memory device 100 can be used for a device other than a computer, for example, a memory device incorporated in a circuit used for driving a display device. FIG. 9 illustrates a configuration example of a display system 400 including a display portion 410 and a control circuit 420 having a function of driving the display portion 410.

The control circuit 420 includes an interface 421, a frame memory 422, a decoder 423, a sensor controller 424, a controller 425, a clock generation circuit 426, an image processing portion 430, a memory device 441, a timing controller 442, a register 443, a driver circuit 450, and a touch sensor controller 461.

The control circuit 420 has a function of generating a signal (hereinafter, also referred to as a video signal) for displaying a predetermined video image and outputting the signal to the display portion 410. The display portion 410 has a function of displaying a video image on each of a display unit 411a and a display unit 411b using the video signal input from the control circuit 420. The display portion 410 may include a touch sensor unit 412 having a function of obtaining data on whether touch operation is performed or not, touch position, and the like. When the display portion 410 is not provided with the touch sensor unit 412, the touch sensor controller 461 can be omitted.

As each of the display units 411a and 411b, a display unit which performs display using a liquid crystal element, a display unit which performs display using a light-emitting element, or the like can be used. The number of the display units provided in the display portion 410 may be one or two or more. FIG. 9 illustrates a configuration example in which the display portion 410 includes a display unit 411a which performs display using a reflective liquid crystal element and a display unit 411b which performs display using a light-emitting element.

A reflective display element other than a reflective liquid crystal element can be used as the display unit 411a. For example, as the display unit 411a, a Micro Electro Mechanical Systems (MEMS) shutter element, an optical interference type MEMS element, a display element using a microcapsule method, an electrophoretic method, an electrowetting method, an Electronic Liquid Powder (registered trademark) method, or the like can be used.

As the light-emitting element, a self-luminous light-emitting element such as an organic light-emitting diode (OLED), a light-emitting diode (LED), a quantum-dot light-emitting diode (QLED), and a semiconductor laser can be used.

The driver circuit 450 includes a source driver 451a and a source driver 451b. The source drivers 451a and 451b are circuits having a function of supplying video signals to the display units 411a and 411b. In FIG. 9, the display portion 410 includes the display units 411a and 411b; thus, the driver circuit 450 includes source drivers 451a and 451b. The source driver 451a has a function of supplying a video signal to the display unit 411a and the source driver 451b has a function of supplying a video signal to the display unit 411b. The source drivers 451a and 451b may be provided in the display portion 410.

Communication between the control circuit 420 and a host 470 is performed through the interface 421. Data corresponding to the image displayed on the display portion 410 (hereinafter, also referred to as image data), a variety of control signals, and the like are transmitted from the host 470 to the control circuit 420. Data on whether touch operation is performed or not, touch position, and the like, which is obtained by the touch sensor controller 461, is transmitted from the control circuit 420 to the host 470. Note that the decision whether the circuits included in the control circuit 420 are chosen or not is made as appropriate depending on the standard of the host 470, the specifications of the display portion 410, and the like.

The frame memory 422 is a memory circuit having a function of storing image data input to the control circuit 420. In the case where compressed image data is transmitted from the host 470 to the control circuit 420, the frame memory 422 can store the compressed image data. The decoder 423 is a circuit for decompressing the compressed image data. When decompression of the image data is not needed, processing is not performed in the decoder 423. The decoder 423 can be provided between the frame memory 422 and the interface 421.

The image processing portion 430 has a function of performing a variety of image processings on the image data input from the frame memory 422 or the decoder 423 to generate a video signal. The image processing portion 430 includes a gamma correction circuit 431, a dimming circuit 432, and a toning circuit 433, for example.

When the source driver 451b includes a circuit (current detection circuit) having a function of detecting current flowing through a light-emitting element included in the display unit 411b, an EL correction circuit 434 may be provided in the image processing portion 430. The EL correction circuit 434 has a function of adjusting luminance of the light-emitting element on the basis of a signal transmitted from the current detection circuit.

The video signal generated in the image processing portion 430 is output to the driver circuit 450 through the memory device 441. The memory device 441 has a function of temporarily storing the video signal. The source drivers 451a and 451b have functions of performing a variety of processings on the video signal input from the memory device 441 and outputting the signal to the display units 411a and 411b.

The timing controller 442 has a function of generating a timing signal or the like that is used in the driver circuit 450, the touch sensor controller 461, and gate drivers included in the display units 411a and 411b.

The touch sensor controller 461 has a function of controlling the operation of the touch sensor unit 412. A signal including touch information detected by the touch sensor unit 412 is processed in the touch sensor controller 461 and transmitted to the host 470 through the interface 421. The host 470 generates image data reflecting the touch information and transmits the image data to the control circuit 420. Note that the control circuit 420 may reflect the touch information in the image data. The touch sensor controller 461 may be provided in the touch sensor unit 412.

The clock generation circuit 426 has a function of generating a clock signal to be used in the control circuit 420. The controller 425 has functions of processing a variety of control signals transmitted from the host 470 through the interface 421 and controlling a variety of circuits in the control circuit 420. The controller 425 also has a function of controlling power supply to the variety of circuits in the control circuit 420. The controller 425 can temporarily stop power supply to a circuit that is not used, for example.

The register 443 has a function of storing data used for the operation of the control circuit 420. The data stored in the register 443 includes a parameter used to perform correction processing in the image processing portion 430, parameters used to generate waveforms of a variety of timing signals in the timing controller 442, and the like. The register 443 can be formed using a scan chain register including a plurality of registers.

The sensor controller 424 connected to an optical sensor 480 can be provided in the control circuit 420. The optical sensor 480 has a function of detecting outside light 481 and generating a detection signal. The sensor controller 424 has a function of generating a control signal on the basis of the detection signal. The control signal generated by the sensor controller 424 is output to the controller 425, for example.

The image processing portion 430 has a function of generating a video signal for the display unit 411a and a video signal for the display unit 411b separately when the display unit 411a and the display unit 411b display the same video image. In that case, reflection intensity of the reflective liquid crystal element of the display unit 411a and emission intensity of the light-emitting element of the display unit 411b can be adjusted in response to brightness of the external light 481 measured using the optical sensor 480 and the sensor controller 424. Here, the adjustment is referred to as dimming or dimming treatment. In addition, a circuit that performs the treatment is referred to as a dimming circuit.

For example, in the case where a video image is displayed on the display portion 410 in the outdoor environment at daytime on a sunny day, the video image can be displayed only by the reflective liquid crystal element without using the light-emitting element. In the case where a video image is displayed on the display portion 410 during night or in a dark environment, the video image can be displayed by making the light-emitting element emit light.

Depending on the brightness of external light, the image processing portion 430 can selectively generate a video signal for performing display only with the display unit 411a, a video signal for performing display only with the display unit 411b, or a video signal for performing display with the display unit 411a and the display unit 411b in combination. Accordingly, favorable display can be performed even in an environment with bright external light or an environment with weak external light. Furthermore, power consumption can be reduced by making the light-emitting element emit no light or reducing the luminance of the light-emitting element in the environment with bright external light.

Color tones can be corrected by combining the display by the light-emitting element with the display by the reflective liquid crystal element. A function of measuring the color tones of the outside light 481 may be added to the optical sensor 480 and the sensor controller 424 to perform such tone correction. For example, in the case where a video image is displayed on the display portion 410 in a reddish environment at evening, a blue (B) component is not sufficient only with the display by the reflective liquid crystal element; thus, the color tones can be corrected by making the light-emitting element emit light. Here, the correction is referred to as toning or toning treatment. In addition, a circuit that performs the toning treatment is referred to as a toning circuit.

The image processing portion 430 might include another processing circuit such as an RGB-RGBW conversion circuit depending on the specifications of the display portion 410. The RGB-RGBW conversion circuit has a function of converting image data of red, green, and blue (RGB) into image signals of red, green, blue, and white (RGBW). That is, in the case where the display portion 410 includes pixels of four colors of RGBW, power consumption can be reduced by displaying a white (W) component in the image data using the white (W) pixel. Note that in the case where the image processing portion 430 includes pixels of four colors of RGBY, a RGB-RGBY (red, green, blue, and yellow) conversion circuit can be used, for example.

The display unit 411a and the display unit 411b can display different video images. Operation speed of the reflective liquid crystal element is low as compared with the light-emitting element, so that it takes time to display a video image in some cases. Thus, a still image used as a background can be displayed by the reflective liquid crystal element and a moving image can be displayed by the light-emitting element. In that case, the frequency of rewriting an image which is displayed by the reflective liquid crystal element can be reduced and the operation of the source driver 451a and the gate driver included in the display unit 411a can be stopped in the period during which the video image is not rewritten. Consequently, display of a smooth moving image and a reduction of power consumption can be achieved at the same time. In this case, the frame memory 422 includes a region in which a video signal supplied to the reflective liquid crystal element is stored and a region in which a video signal supplied to the light-emitting element is stored.

For the frame memory 422 or the memory device 441 in FIG. 9, the semiconductor device 10 or the memory device 100 which are described in the above embodiments can be used. Thus, a highly reliable control circuit or a highly reliable display system can be achieved.

This embodiment can be combined with any of the other embodiments as appropriate.

Embodiment 4

In this embodiment, configuration examples of a display device that can be used for the display system described in Embodiment 3 are described. The display device described below can be used for the display portion 410 in FIG. 9. In particular, a display device which can perform display using a reflective liquid crystal element and a light-emitting element is described.

Figure 10A:
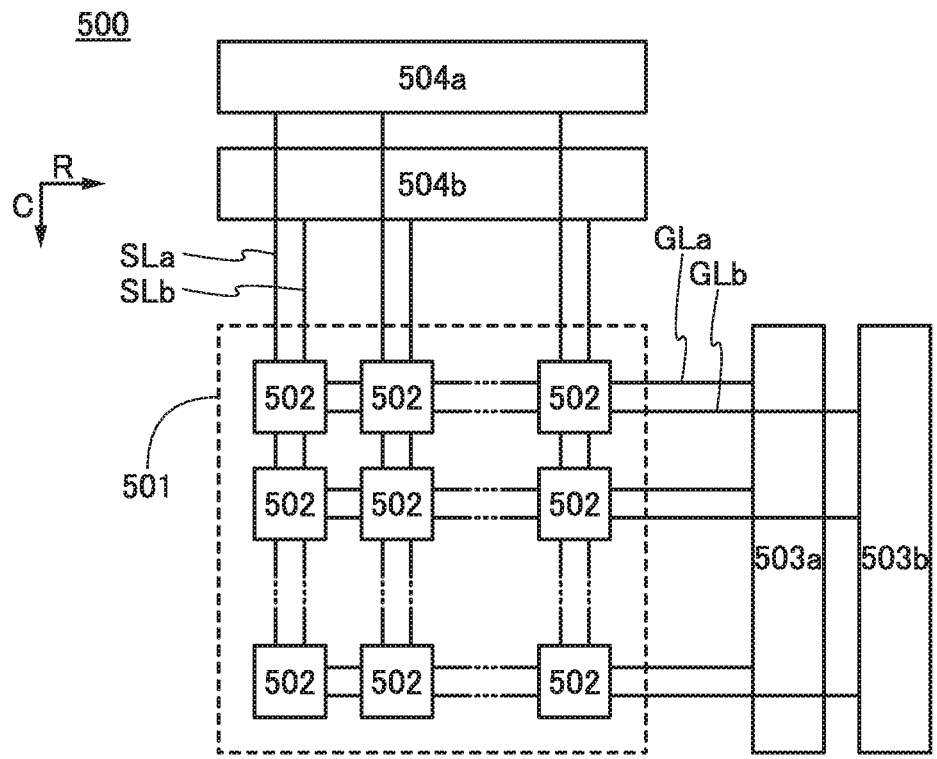
Figure 10A:
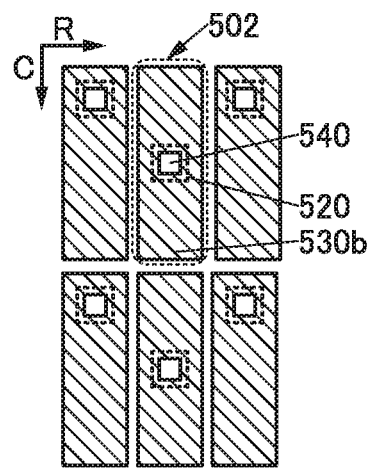
Figure 10A:
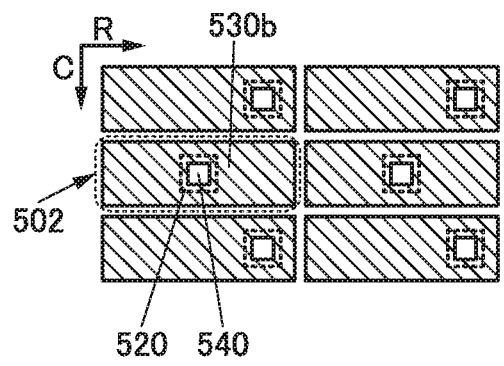

FIG. 10A is a block diagram illustrating a configuration example of a display device 500. The display device 500 includes a plurality of pixel units 502 arranged in a matrix in a pixel portion 501. Furthermore, the display device 500 includes driver circuits 503a and 503b and driver circuits 504a and 504b. The display device 500 also includes a plurality of wirings GLa connected to a plurality of the pixel units 502 which are arranged in a direction R and the driver circuit 503a, and a plurality of wirings GLb connected to a plurality of the pixel units 502 which are arranged in the direction R and the driver circuit 503b. The display device 500 includes a plurality of wirings SLa connected to a plurality of the pixel units 502 which are arranged in the direction C and the driver circuit 504a, and a plurality of wirings SLb connected to a plurality of the pixel units 502 which are arranged in the direction C and the driver circuit 504b.

Figure 11:
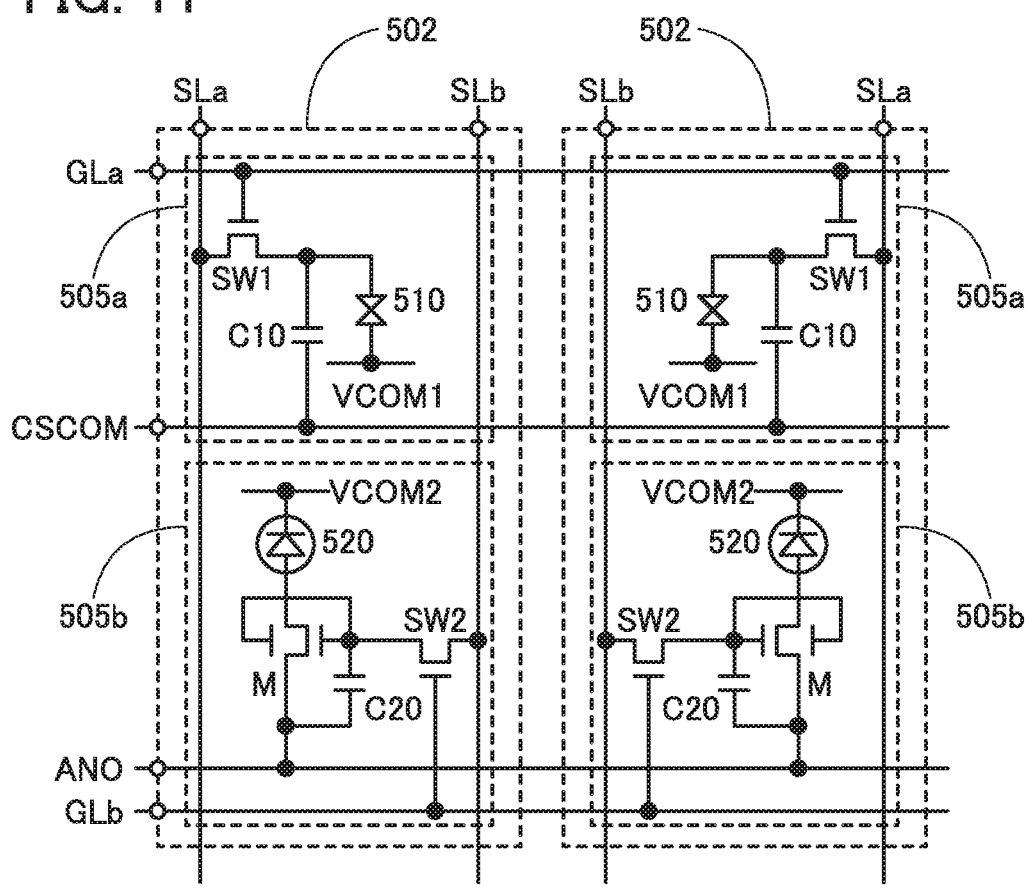
FIG. 11 illustrates a configuration example of a pixel.
Figure 12A:
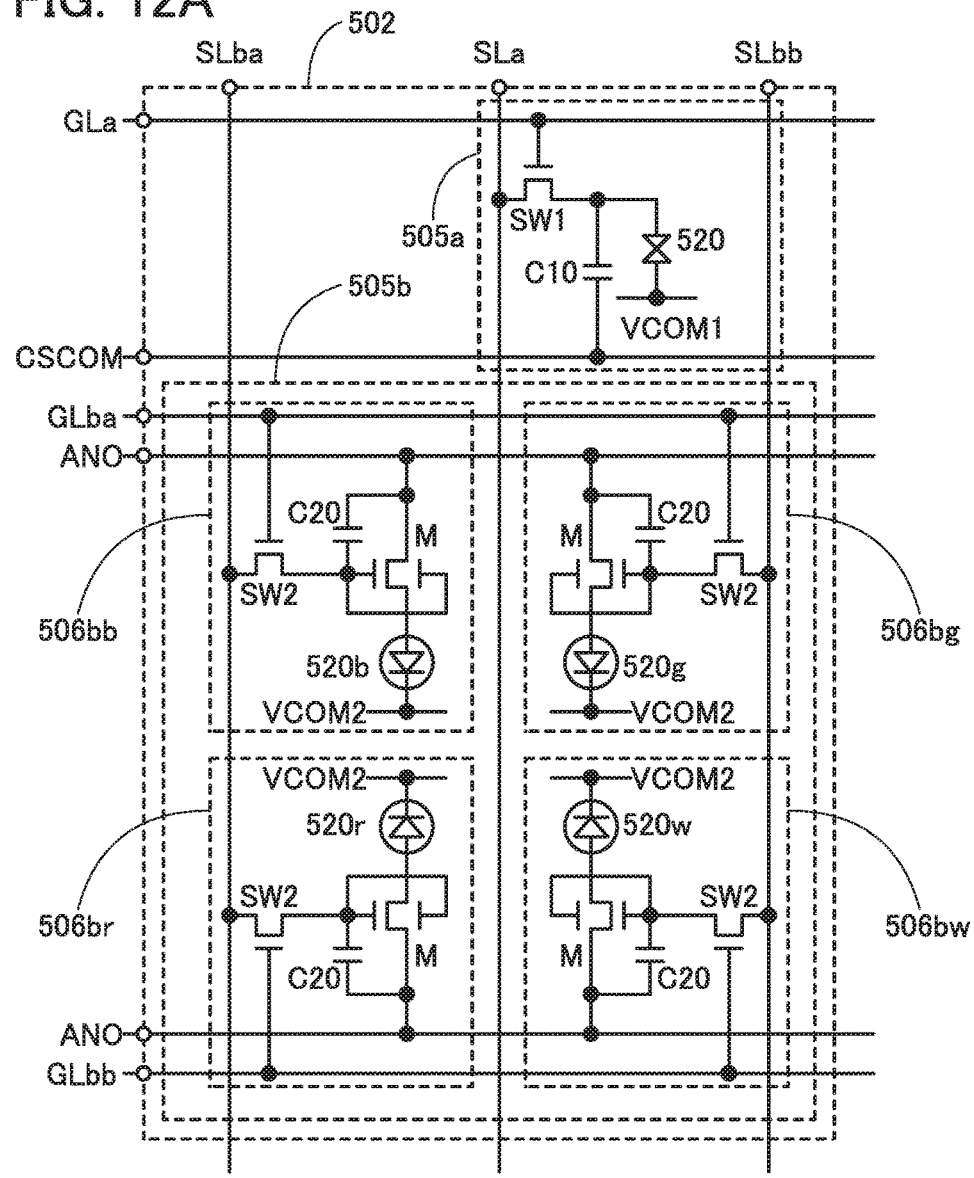
FIGS. 12A and 12B illustrate configuration examples of a pixel.

The driver circuits 504a and 504b correspond to the source drivers 451a and 451b in FIG. 9, respectively. That is, the display device 500 has a configuration in which the source drivers 451a and 451b in FIG. 9 are provided in the display portion 410. Note that the driver circuits 504a and 504b may be provided in the control circuit 420 in FIG. 9. The wirings SL illustrated in FIG. 10A, FIG. 11, and FIG. 12A are different from the wirings SL described in Embodiment 1.

The pixel unit 502 includes a reflective liquid crystal element and a light-emitting element. In the pixel unit 502, the liquid crystal element and the light emitting element partly overlap with each other.

FIG. 10B1 illustrates a configuration example of a conductive layer 530b included in the pixel unit 502. The conductive layer 530b functions as a reflective electrode of the liquid crystal element in the pixel unit 502. The conductive layer 530b includes an opening 540.

In FIG. 10B1, a light-emitting element 520 in a region overlapping with the conductive layer 530b is denoted by a dashed line. The light-emitting element 520 overlaps with the opening 540 included in the conductive layer 530b. Thus, light from the light-emitting element 520 is emitted to a display surface side through the opening 540.

In FIG. 10B1, the pixel units 502 adjacent in the direction R correspond to different colors. As illustrated in FIG. 10B1, the openings 540 are preferably provided in different positions in the conductive layers 530b so as not to be aligned in the two pixels adjacent to each other in the direction R. This allows two adjacent light-emitting elements 520 to be apart from each other, thereby preventing light emitted from the light-emitting element 520 from entering a coloring layer in the adjacent pixel unit 502 (such a phenomenon is also referred to as crosstalk). Furthermore, since the two adjacent light-emitting elements 520 can be arranged apart from each other, a high-resolution display device can be obtained even when EL layers of the light-emitting elements 520 are separately formed with a shadow mask or the like.

Alternatively, arrangement illustrated in FIG. 10B2 may be employed.

If the ratio of the total area of the opening 540 to the total area except for the opening is too large, display performed using the liquid crystal element is dark. If the ratio of the total area of the opening 540 to the total area except for the opening is too small, display performed using the light-emitting element 520 is dark.

If the area of the opening 540 in the conductive layer 530b functioning as a reflective electrode is too small, light emitted from the light-emitting element 520 is not efficiently extracted for display.

The shape of the opening 540 can be, for example, polygonal, quadrangular, elliptical, circular, or cross-shaped. Alternatively, the opening 540 may have a stripe shape, a slit shape, or a checkered pattern. The opening 540 may be close to the adjacent pixel. Preferably, the opening 540 is provided close to another pixel emitting light of the same color, in which case crosstalk can be suppressed.

<Configuration Example of Circuit>

FIG. 11 is a circuit diagram illustrating a configuration example of the pixel unit 502. FIG. 11 illustrates two adjacent pixel units 502. The pixel units 502 each include a pixel 505a and a pixel 505b.

The pixel 505a includes a switch SW1, a capacitor C10, and a liquid crystal element 510 and the pixel 505b includes a switch SW2, a transistor M, a capacitor C20, and the light-emitting element 520. The pixel 505a is connected to the wiring SLa, the wiring GLa, and a wiring CSCOM and the pixel 505b is connected to the wiring GLb, the wiring SLb, and a wiring ANO. FIG. 11 illustrates a wiring VCOM1 connected to the liquid crystal element 510 and a wiring VCOM2 connected to the light-emitting element 520. FIG. 11 illustrates an example in which a transistor is used as each of the switches SW1 and SW2.

A gate of the switch SW1 is connected to the wiring GLa. One of a source and a drain of the switch SW1 is connected to the wiring SLa, and the other of the source and the drain of the switch SW1 is connected to one electrode of the capacitor C10 and one electrode of the liquid crystal element 510. The other electrode of the capacitor C10 is connected to the wiring CSCOM. The other electrode of the liquid crystal element 510 is connected to the wiring VCOM1.

A gate of the switch SW2 is connected to the wiring GLb. One of a source and a drain of the switch SW2 is connected to the wiring SLb, and the other of the source and the drain of the switch SW2 is connected to one electrode of the capacitor C20 and a gate of the transistor M. The other electrode of the capacitor C20 is connected to one of a source and a drain of the transistor M and the wiring ANO. The other of the source and the drain of the transistor M is connected to one electrode of the light-emitting element 520. The other electrode of the light-emitting element 520 is connected to the wiring VCOM2.

FIG. 11 illustrates an example in which the transistor M includes a pair of gates which are connected to each other. This configuration can increase the amount of current flowing through the transistor M.

A predetermined potential can be supplied to each of the wirings VCOM1 and CSCOM. A potential which can generate a potential difference capable of making the light-emitting element 520 emit light can be supplied to each of the wirings VCOM2 and ANO.

In the pixel unit 502 illustrated in FIG. 11, for example, in the case where display in the reflective mode is performed, a video image can be displayed by driving the pixel 505a with the signals supplied to the wirings GLa and SLa and utilizing the optical modulation of the liquid crystal element 510. In the case where display is performed in the transmissive mode, a video image can be displayed by driving the pixel 505b with the signals supplied to the wirings GLb and SLb and making the light-emitting element 520 emit light. In the case where driving is performed in both of the modes, the pixels 505a and 505b can be driven with the signals supplied to the wirings GLa, GLb, SLa, and SLb.

Although FIG. 11 illustrates an example in which one liquid crystal element 510 and one light-emitting element 520 are provided in one pixel unit 502, one embodiment of the present invention is not limited thereto. As illustrated in FIG. 12A, the pixel 505b may include a plurality of subpixels 506b (506br, 506bg, 506bb, and 506bw), for example. The subpixels 506br, 506bg, 506bb, and 506bw include light-emitting elements 520r, 520g, 520b, and 520w, respectively. The pixel unit 502 illustrated in FIG. 12A differs from that in FIG. 11 in being capable of performing full-color display by one unit.

In FIG. 12A, wirings GLba, GLbb, SLba, and SLbb are connected to the pixel 505b.

In the example illustrated in FIG. 12A, for example, light-emitting elements which exhibit red (R), green (G), blue (B), and white (W) can be used as the four light-emitting elements 520. A reflective liquid crystal element which exhibits white can be used as the liquid crystal element 510. Thus, in the case of performing display in the reflective mode, white display with high reflectivity can be performed. In the case of performing display in the transmissive mode, images can be displayed with a higher color rendering property at low power consumption.

Figure 12B:
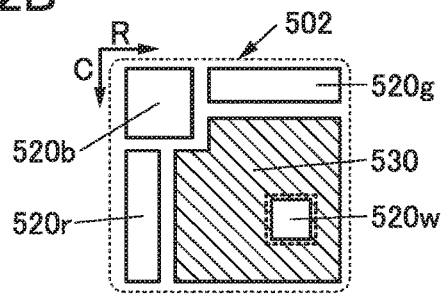

FIG. 12B is a configuration example of the pixel unit 502. The pixel unit 502 includes the light-emitting element 520w overlapping with an opening of a conductive layer 530, and the light-emitting elements 520r, 520g, and 520b which are arranged in the periphery of the conductive layer 530. It is preferable that the light-emitting elements 520r, 520g, and 520b have substantially the same light-emitting area.

<Structure Example of Display Device>

Figure 13:
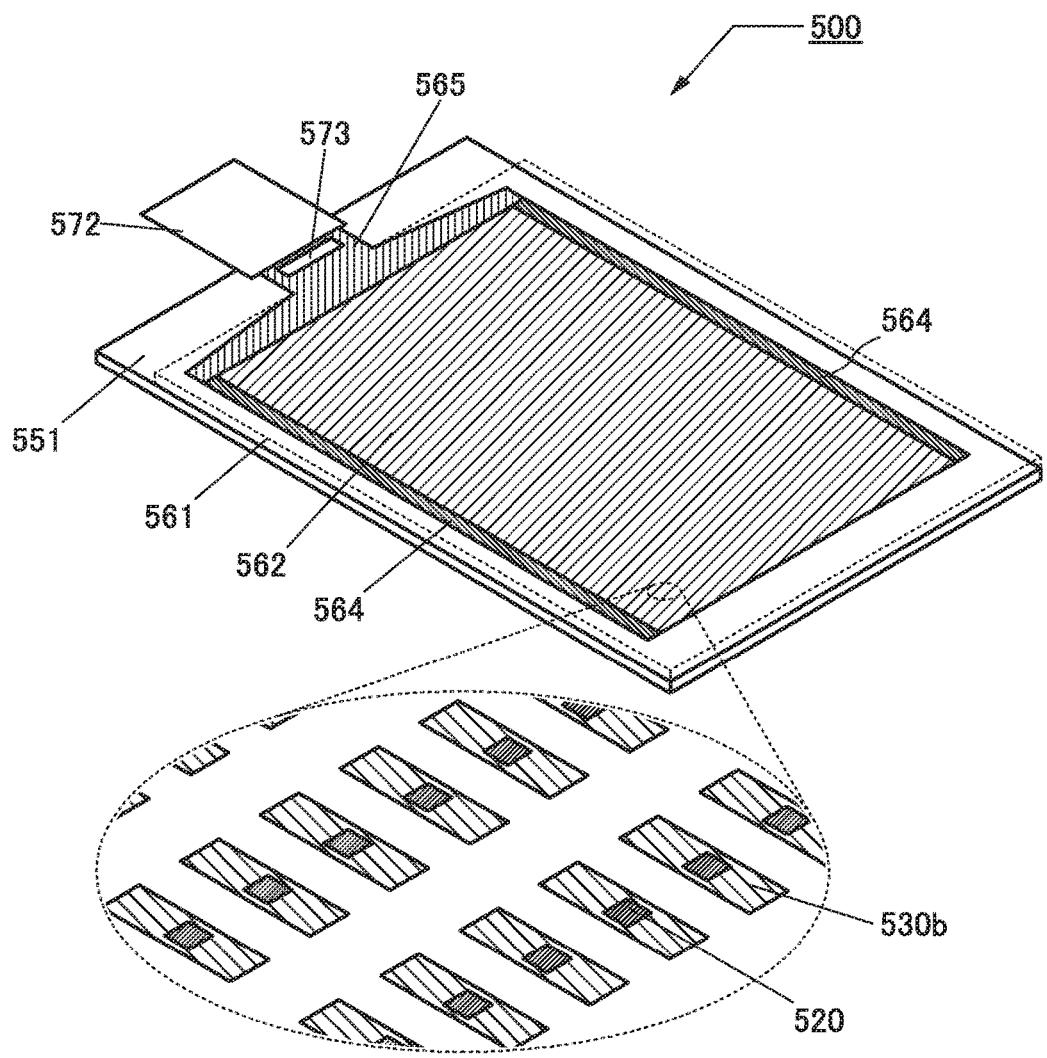
FIG. 13 illustrates a structure example of a display device.

FIG. 13 is a schematic perspective view of the display device 500 of one embodiment of the present invention. In the display device 500, a substrate 551 and a substrate 561 are attached to each other. In FIG. 13, the substrate 561 is denoted by a dashed line.

The display device 500 includes a display portion 562, a circuit 564, a wiring 565, and the like. The substrate 551 is provided with the circuits 564, the wiring 565, the conductive layer 530b which functions as a pixel electrode, and the like. In FIG. 13, an IC 573 and an FPC 572 are mounted on the substrate 551, for example. Thus, the structure illustrated in FIG. 13 can be referred to as a display module including the display device 500, the FPC 572, and the IC 573.

As the circuit 564, for example, a circuit functioning as a driver circuit 504 can be used.

The wiring 565 has a function of supplying a signal or electric power to the display portion 562 or the circuit 564. The signal or electric power is input to the wiring 565 from the outside through the FPC 572 or from the IC 573.

FIG. 13 shows an example in which the IC 573 is provided on the substrate 551 by a chip on glass (COG) method or the like. As the IC 573, for example, an IC functioning as the driver circuit 503, the driver circuit 504, or the like can be used. Note that it is possible that the IC 573 is not provided when, for example, the display device 500 includes circuits functioning as the driver circuit 503 and the driver circuit 504 and when the circuits functioning as the driver circuit 503 and the driver circuit 504 are provided outside and a signal for driving the display device 500 is input through the FPC 572. Alternatively, the IC 573 may be mounted on the FPC 572 by a chip on film (COF) method or the like.

FIG. 13 illustrates an enlarged view of part of the display portion 562. The conductive layers 530b included in a plurality of display elements are arranged in a matrix in the display portion 562. The conductive layer 530b has a function of reflecting visible light and functions as a reflective electrode of the liquid crystal element 510 described later.

As illustrated in FIG. 13, the conductive layer 530b has an opening. The light-emitting element 520 is positioned closer to the substrate 551 than the conductive layer 530b is. Light is emitted from the light-emitting element 520 to the substrate 561 side through the opening of the conductive layer 530b.

Figure 14:
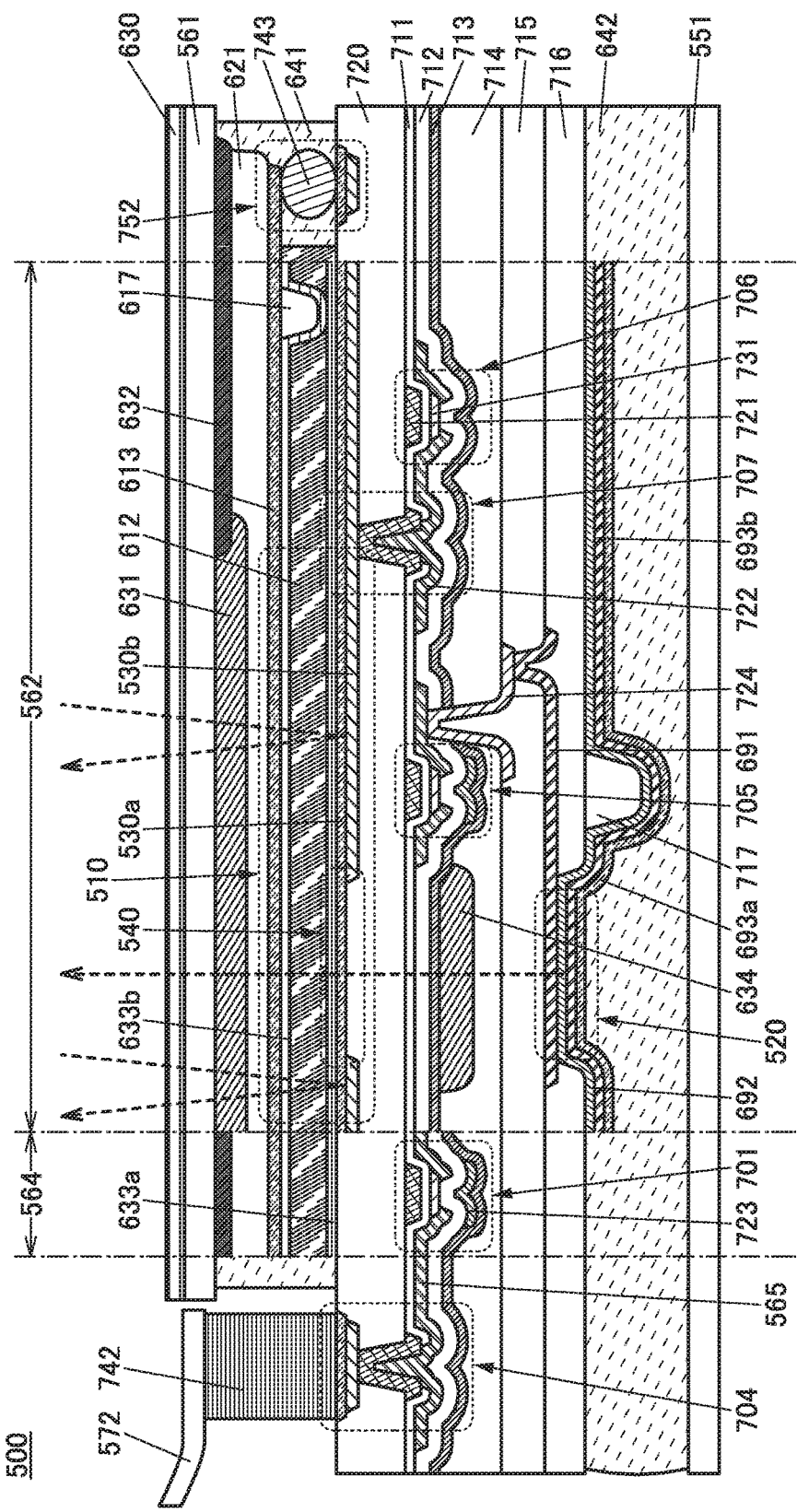
FIG. 14 illustrates a structure example of a display device.

FIG. 14 illustrates an example of cross sections of part of a region including the FPC 572, part of a region including the circuit 564, and part of a region including the display portion 562 of the display device illustrated in FIG. 13.

The display device 500 includes an insulating layer 720 between the substrates 551 and 561. The display device also includes the light-emitting element 520, a transistor 701, a transistor 705, a transistor 706, a coloring layer 634, and the like between the substrate 551 and the insulating layer 720. Furthermore, the display device 500 includes the liquid crystal element 510, a coloring layer 631, and the like between the insulating layer 720 and the substrate 561. The substrate 561 and the insulating layer 720 are bonded with an adhesive layer 641. The substrate 551 and the insulating layer 716 are bonded with an adhesive layer 642.

The transistor 706 and the transistor 705 are connected to the liquid crystal element 510 and the light-emitting element 520, respectively. Since the transistors 705 and 706 are formed on a surface of the insulating layer 720 which is on the substrate 551 side, the transistors 705 and 706 can be formed through the same process.

The substrate 561 is provided with the coloring layer 631, a light-blocking layer 632, an insulating layer 621, a conductive layer 613 functioning as a common electrode of the liquid crystal element 510, an alignment film 633b, an insulating layer 617, and the like. The insulating layer 617 functions as a spacer for holding a cell gap of the liquid crystal element 510.

Insulating layers such as an insulating layer 711, an insulating layer 712, an insulating layer 713, an insulating layer 714, an insulating layer 715, and an insulating layer 716 are provided on the substrate 551 side of the insulating layer 720. Part of the insulating layer 711 functions as a gate insulating layer of each transistor. The insulating layer 712, the insulating layer 713, and the insulating layer 714 are provided to cover each transistor. The insulating layer 715 is provided to cover the insulating layer 714. The insulating layers 714 and 715 each function as a planarization layer. Note that an example where the insulating layers 712, 713, and 714 are provided to cover the transistors and the like is described here; however, one embodiment of the present invention is not limited to this example, and four or more insulating layers, a single insulating layer, or two insulating layers may be provided. The insulating layer 714 functioning as a planarization layer is not necessarily provided.

The transistor 701, the transistor 705, and the transistor 706 each include a conductive layer 721 part of which functions as a gate, conductive layers 722 part of which functions as a source and a drain, and a semiconductor layer 731. Here, a plurality of layers obtained by processing the same conductive film are shown with the same hatching pattern.

The liquid crystal element 510 is a reflective liquid crystal element. The liquid crystal element 510 has a stacked structure of a conductive layer 530a, a liquid crystal 612, and the conductive layer 613. The conductive layer 530b which reflects visible light is provided in contact with the surface of the conductive layer 530a that faces the substrate 551. The conductive layer 530b includes the opening 540. The conductive layers 530a and 613 each contain a material transmitting visible light. In addition, an alignment film 633a is provided between the liquid crystal 612 and the conductive layer 530a and the alignment film 633b is provided between the liquid crystal 612 and the conductive layer 613. A polarizing plate 630 is provided on an outer surface of the substrate 561.

In the liquid crystal element 510, the conductive layer 530b has a function of reflecting visible light and the conductive layer 613 has a function of transmitting visible light. Light entering from the substrate 561 side is polarized by the polarizing plate 630, passes through the conductive layer 613 and the liquid crystal 612, and is reflected by the conductive layer 530b. Then, the light passes through the liquid crystal 612 and the conductive layer 613 again and reaches the polarizing plate 630. In this case, alignment of the liquid crystal is controlled with a voltage that is applied between the conductive layers 530b and 613, and thus optical modulation of light can be controlled. In other words, the intensity of light emitted through the polarizing plate 630 can be controlled. Light excluding light in a particular wavelength region is absorbed by the coloring layer 631, and thus, emitted light is red light, for example.

The light-emitting element 520 is a bottom-emission light-emitting element. The light-emitting element 520 has a structure in which a conductive layer 691, an EL layer 692, and a conductive layer 693b are stacked in this order from the insulating layer 720 side. In addition, a conductive layer 693a is provided to cover the conductive layer 693b. The conductive layer 693b contains a material reflecting visible light, and the conductive layers 691 and 693a each contain a material transmitting visible light. Light is emitted from the light-emitting element 520 to the substrate 561 side through the coloring layer 634, the insulating layer 720, the opening 540, the conductive layer 613, and the like.

Here, as illustrated in FIG. 14, the conductive layer 530a transmitting visible light is preferably provided for the opening 540. Accordingly, the liquid crystal 612 is aligned in a region overlapping with the opening 540 as well as in the other regions, in which case an alignment defect of the liquid crystal is prevented from being generated in the boundary portion of these regions and undesired light leakage can be suppressed.

As the polarizing plate 630 provided on an outer surface of the substrate 561, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 510 are controlled depending on the kind of the polarizing plate so that desirable contrast is obtained.

An insulating layer 717 is provided on the insulating layer 716 covering an end portion of the conductive layer 691. The insulating layer 717 has a function as a spacer for preventing the insulating layer 720 and the substrate 551 from getting closer more than necessary. In the case where the EL layer 692 or the conductive layer 693a is formed using a blocking mask (metal mask), the insulating layer 717 may have a function as a spacer for preventing the blocking mask from being in contact with a surface on which the EL layer 692 or the conductive layer 693a is formed. Note that the insulating layer 717 is not necessarily provided.

One of a source and a drain of the transistor 705 is connected to the conductive layer 691 of the light-emitting element 520 through a conductive layer 724.

One of a source and a drain of the transistor 706 is electrically connected to the conductive layer 530b through a connection portion 707. The conductive layer 530b and the conductive layer 530a are in contact with and connected to each other. Here, in the connection portion 707, the conductive layers provided on both surfaces of the insulating layer 720 are connected to each other through an opening in the insulating layer 720.

A connection portion 704 is provided in a region where the substrates 551 and 561 do not overlap with each other. The connection portion 704 is connected to the FPC 572 through a connection layer 742. The connection portion 704 has a structure similar to that of the connection portion 707. On the top surface of the connection portion 704, a conductive layer obtained by processing the same conductive film as the conductive layer 530a is exposed. Thus, the connection portion 704 and the FPC 572 can be connected to each other through the connection layer 742.

A connection portion 752 is provided in part of a region where the adhesive layer 641 is provided. In the connection portion 752, the conductive layer obtained by processing the same conductive film as the conductive layer 530a is connected to part of the conductive layer 613 with a connector 743. Accordingly, a signal or a potential input from the FPC 572 connected to the substrate 551 side can be supplied to the conductive layer 613 formed on the substrate 561 side through the connection portion 752.

As the connector 743, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 743, a material capable of elastic deformation or plastic deformation is preferably used. As illustrated in FIG. 14, the connector 743 which is the conductive particle has a shape that is vertically crushed in some cases. With the crushed shape, the contact area between the connector 743 and a conductive layer electrically connected to the connector 743 can be increased, thereby reducing contact resistance and suppressing the generation of problems such as disconnection.

The connector 743 is preferably provided so as to be covered with the adhesive layer 641. For example, the connectors 743 are dispersed in the adhesive layer 641 before curing of the adhesive layer 641.

FIG. 14 illustrates an example of the circuit 564 in which the transistor 701 is provided.

The structure in which the semiconductor layer 731 where a channel is formed is provided between a pair of gates is used as an example of the transistors 701 and 705 in FIG. 14. One gate is formed by the conductive layer 721 and the other gate is formed by a conductive layer 723 overlapping with the semiconductor layer 731 with the insulating layer 712 provided therebetween. Such a structure enables control of the threshold voltages of the transistors. In that case, the two gate electrodes may be connected to each other and supplied with the same signal to operate the transistors. Such transistors can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Note that the transistor included in the circuit 564 and the transistor included in the display portion 562 may have the same structure. A plurality of transistors included in the circuit 564 may have the same structure or different structures. A plurality of transistors included in the display portion 562 may have the same structure or different structures.

A material through which impurities such as water or hydrogen do not easily diffuse is preferably used for at least one of the insulating layers 712 and 713 which cover the transistors. That is, the insulating layer 712 or the insulating layer 713 can function as a barrier film. Such a structure can effectively suppress diffusion of the impurities into the transistors from the outside, and a highly reliable display device can be achieved.

The insulating layer 621 is provided on the substrate 561 side to cover the coloring layer 631 and the light-blocking layer 632. The insulating layer 621 may have a function as a planarization layer. The insulating layer 621 enables the conductive layer 613 to have an almost flat surface, resulting in a uniform alignment state of the liquid crystal 612.

An example of the manufacturing method of the display device 500 is described. For example, the conductive layer 530a, the conductive layer 530b, and the insulating layer 720 are formed in this order over a support substrate provided with a separation layer, and the transistor 705, the transistor 706, the light-emitting element 520, and the like are formed. Then, the substrate 551 and the support substrate are bonded with the adhesive layer 642. After that, separation is performed at the interface between the separation layer and each of the insulating layer 720 and the conductive layer 530a, whereby the support substrate and the separation layer are removed. Separately, the coloring layer 631, the light-blocking layer 632, the conductive layer 613, and the like are formed over the substrate 561 in advance. Then, the liquid crystal 612 is dropped onto the substrate 551 or 561 and the substrates 551 and 561 are bonded with the adhesive layer 641, whereby the display device 500 can be manufactured.

A material for the separation layer can be selected such that separation at the interface with the insulating layer 720 and the conductive layer 530a occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating layer 720 over the separation layer. The use of the high-melting-point metal material for the separation layer can increase the formation temperature of a layer formed in a later step, which reduces impurity concentration and achieves a highly reliable display device.

As the conductive layer 530a, a metal oxide, a metal nitride, or the like is preferably used. In the case of using a metal oxide, a material in which at least one of the concentrations of hydrogen, boron, phosphorus, nitrogen, and other impurities and the number of oxygen vacancies is made to be higher than those in a semiconductor layer of a transistor is used for the conductive layer 530a.

The above components will be described below.

[Substrate]

A substrate having a flat surface can be used as the substrate included in the display device. The substrate through which light emitted from the display element is extracted is formed using a material that transmits the light. For example, a material such as glass, quartz, ceramics, sapphire, or an organic resin can be used.

The weight and thickness of the display device can be decreased by using a thin substrate. Furthermore, a flexible display device can be obtained by using a substrate that is thin enough to have flexibility.

Since the substrate through which light emission is not extracted does not need to have a light-transmitting property, a metal substrate or the like can be used in addition to the above-mentioned substrates. A metal substrate is preferable because the metal substrate can easily conduct heat to the whole substrate and accordingly can prevent a local temperature rise in the display device. To obtain flexibility or bendability, the thickness of a metal substrate is preferably greater than or equal to 10 μm and less than or equal to 200 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of materials having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET with a thermal expansion coefficient of $30 \times 10^{-6}$/K or less can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like can be given. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded with an adhesive layer may be used.

A hard coat layer (e.g., a silicon nitride layer and an aluminum oxide layer) by which a surface of a display device is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. In particular, when a glass layer is used, a barrier property against water and oxygen can be improved, and thus, a highly reliable display device can be provided.

[Transistor]

The transistor includes a conductive layer functioning as the gate electrode, a semiconductor layer, a conductive layer functioning as the source electrode, a conductive layer functioning as the drain electrode, and an insulating layer functioning as the gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for a semiconductor layer of the transistor, an element of Group 14 (e.g., silicon or germanium) or a metal oxide can be used, for example. Typically, a semiconductor containing silicon, a semiconductor containing gallium arsenide, a metal oxide containing indium, or the like can be used.

In particular, a metal oxide having a wider band gap than silicon is preferably used. A semiconductor material having a wider band gap and a lower carrier density than silicon is preferably used because the current in an off state of the transistor can be reduced.

A transistor with a metal oxide whose band gap is larger than the band gap of silicon has a low off-state current; therefore, charges stored in a capacitor that is series-connected to the transistor can be held for a long period. When such a transistor is used for a pixel, operation of a driver circuit can be stopped while a gray scale of an image displayed in each pixel is maintained. As a result, a display device with extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the semiconductor layer, the oxide semiconductor preferably contains a stabilizer in addition to indium, zinc, and M.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of a metal oxide included in the semiconductor layer is 2 eV or more, preferably 2.5 eV or more, and more preferably 3 eV or more. With the use of a metal oxide having such a wide energy gap, the off-state current of the transistor can be reduced.

In the case where a metal oxide included in the semiconductor layer is an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

A metal oxide with low carrier density is preferably used as the semiconductor layer. For example, the semiconductor layer can include a metal oxide whose carrier density is lower than or equal to $1 \times 10^{17}/cm^3$, preferably lower than or equal to $1 \times 10^{15}/cm^3$, more preferably lower than or equal to $1 \times 10^{13}/cm^3$, still more preferably lower than or equal to $1 \times 10^{11}/cm^3$, even more preferably lower than $1 \times 10^{10}/cm^3$, and higher than or equal to $1 \times 10^{-9}/cm^3$. Such an oxide semiconductor layer has a low impurity concentration and a low density of defect states and thus have stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in a metal oxide included in the semiconductor layer, oxygen vacancies are increased in the semiconductor layer, and the semiconductor layer becomes n-type in some cases. Thus, the concentration of silicon or carbon (measured by secondary ion mass spectrometry) in the semiconductor layer is lower than or equal to $2 \times 10^{18}$ atoms/$cm^3$, preferably lower than or equal to $2 \times 10^{17}$ atoms/$cm^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is lower than or equal to $1 \times 10^{18}$ atoms/$cm^3$, preferably lower than or equal to $2 \times 10^{16}$ atoms/$cm^3$.

When nitrogen is contained in a metal oxide included in the semiconductor layer, electrons serving as carriers are generated and the carrier density increases, so that the semiconductor layer easily becomes n-type. Thus, a transistor including a metal oxide which contains nitrogen is likely to be normally on. Hence, the concentration of nitrogen which is measured by secondary ion mass spectrometry is preferably set to lower than or equal to $5 \times 10^{18}$ atoms/$cm^3$.

The semiconductor layer may have a non-single-crystal structure, for example. The non-single-crystal structure includes a polycrystalline structure, a microcrystalline structure, or an amorphous structure, for example. Among the non-single-crystal structures, an amorphous structure has the highest density of defect states.

A metal oxide having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, and a region having a single-crystal structure. Furthermore, the mixed film has a single-layer structure including two or more of the above regions and a region having a stacked-layer structure in some cases.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where a display portion with extremely high definition is provided, driver circuits can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics or the like can be reduced. In that case, the use of polycrystalline silicon, single-crystal silicon, or the like is particularly preferable.

[Conductive Layer]

As materials for a gate, a source, and a drain of a transistor, and a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and a conductive layer (e.g., a conductive layer functioning as a pixel electrode or a common electrode) included in a display element.

[Insulating Layer]

Examples of an insulating material that can be used for the insulating layers and the like include a resin such as acrylic or epoxy resin, a resin having a siloxane bond such as silicone, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, the liquid crystal element can employ, besides the VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, or an antiferroelectric liquid crystal (AFLC) mode.

The liquid crystal element controls transmission or non-transmission of light by utilizing an optical modulation action of the liquid crystal. Note that the optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used; an appropriate liquid crystal material may be used in accordance with the mode or design to be used.

In addition, to control the alignment of the liquid crystal, an alignment film can be provided. In the case where a horizontal electric field mode is employed, a liquid crystal exhibiting a blue phase for which an alignment film is unnecessary may be used. The blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal exhibiting a blue phase and a chiral material has a short response time and optical isotropy. In addition, the liquid crystal composition which includes a liquid crystal exhibiting a blue phase and a chiral material does not need alignment treatment and has a small viewing angle dependence. Since an alignment film need not be provided and rubbing treatment is unnecessary, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used. In one embodiment of the present invention, in particular, a reflective liquid crystal element is preferably used.

In the case where a transmissive or semi-transmissive liquid crystal element is used, two polarizing plates are provided so that a pair of substrates is sandwiched therebetween. A backlight is provided outside the polarizing plates. As the backlight, a direct-lit backlight or an edge-lit backlight may be used. A direct-lit backlight including a light-emitting diode (LED) is preferably used because local dimming is easily performed to improve contrast. An edge-lit backlight is preferably used because the thickness of a module including the backlight can be reduced.

In the case where a reflective liquid crystal element is used, a polarizing plate is provided on the display surface side. In addition, a light diffusion plate is preferably provided on the display surface side to improve visibility.

In the case where a reflective or semi-transmissive liquid crystal element is used, a front light may be provided outside the polarizing plate. As the front light, an edge-lit front light is preferably used. A front light including an LED is preferably used because power consumption can be reduced.

[Light-Emitting Element]

As the light-emitting element, a self-luminous element can be used, and an element whose luminance is controlled by current or voltage is included in the category of the light-emitting element. For example, an LED, an organic EL element, or an inorganic EL element can be used.

The light-emitting element has a top emission structure, a bottom emission structure, a dual emission structure, or the like. A conductive film that transmits visible light is used as an electrode through which light is extracted. A conductive film that reflects visible light is preferably used as an electrode through which light is not extracted. In one embodiment of the present invention, in particular, a bottom-emission light-emitting element is preferably used.

The EL layer includes at least a light-emitting layer. In addition to the light-emitting layer, the EL layer may include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

Either a low-molecular compound or a high-molecular compound can be used for the EL layer, and an inorganic compound may also be used. Each of the layers included in the EL layer can be formed by an evaporation method (including a vacuum evaporation method), a transfer method, a printing method, an inkjet method, a coating method, or the like.

When a voltage higher than the threshold voltage of the light-emitting element is applied between a cathode and an anode, holes from the anode side and electrons from the cathode side are injected into the EL layer. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, two or more light-emitting substances which emit light of complementary colors may be selected to obtain white light emission. For example, the EL layer preferably contains two or more light-emitting substances selected from light-emitting substances which emit light of red (R), green (G), blue (B), yellow (Y), orange (O), and the like and light-emitting substances which emit light including two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength region preferably includes spectral components also in green and red wavelength regions.

A light-emitting layer containing a light-emitting material emitting light of one color and a light-emitting layer containing a light-emitting material emitting light of another color are preferably stacked in the EL layer. For example, a plurality of the light-emitting layers in the EL layer may be stacked in contact with each other, or a region which contains neither of the light-emitting materials may be provided between the stacked light-emitting layers. For example, between a fluorescent light-emitting layer and a phosphorescent light-emitting layer, a region which contains the same material (e.g., a host material or an assist material) as the fluorescent light-emitting layer or the phosphorescent light-emitting layer and neither of their light-emitting materials may be provided. This facilitates the manufacture of the light-emitting element and reduces the drive voltage.

The light-emitting element may be a single element including one EL layer or a tandem element in which a plurality of EL layers are stacked with a charge generation layer provided therebetween.

The conductive film that transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium, an alloy containing the metal material, a nitride of the metal material (e.g., titanium nitride), or the like can be used when formed thin enough to transmit light. Alternatively, a stacked film of any of the above materials can be used as the conductive layer. For example, a stacked film of indium tin oxide and an alloy of silver and magnesium is preferably used because the conductivity can be increased. Alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing the metal material can be used. Lanthanum, neodymium, germanium, or the like may be added to the metal material or the alloy. Alternatively, an aluminum alloy may be used, namely an alloy containing aluminum and titanium, nickel, or neodymium. Alternatively, an alloy containing silver and copper, palladium, or magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material of the metal film or the metal oxide film include titanium and titanium oxide. Alternatively, the conductive film that transmits visible light and a film containing the above metal material may be stacked. For example, a stacked film of silver and indium tin oxide or a stacked film of indium tin oxide and an alloy of silver and magnesium can be used.

Each of the electrodes may be formed by an evaporation method or a sputtering method. Alternatively, a discharging method such as an inkjet method, a printing method such as a screen printing method, or a plating method can be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may each contain an inorganic compound such as a quantum dot or a high-molecular compound (e.g., an oligomer, a dendrimer, or a polymer). For example, a quantum dot used for the light-emitting layer can function as a light-emitting material.

The quantum dot material can be a colloidal quantum dot material, an alloyed quantum dot material, a core-shell quantum dot material, a core quantum dot material, or the like. A material containing elements belonging to Groups 12 and 16, elements belonging to Groups 13 and 15, or elements belonging to Groups 14 and 16 may be used. Alternatively, a quantum dot material containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Alternatively, an adhesive sheet or the like may be used.

Furthermore, the resin may contain a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably contained because it can prevent impurities such as moisture from entering the element, thereby improving the reliability of the display device.

In addition, a filler with a high refractive index or a light-scattering member may be mixed with the resin, in which case the light extraction efficiency can be improved. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stack of films containing materials of the coloring layers can also be used as the light-blocking layer. For example, a stacked-layer structure of a film containing a material of a coloring layer that transmits light of a certain color and a film containing a material of a coloring layer that transmits light of another color can be employed. The coloring layer and the light-blocking layer are preferably formed using the same material because the same manufacturing apparatus can be used and the process can be simplified.

The above is the description of each of the components.

[Manufacturing Method Example]

A manufacturing method example of a display device using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 µm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer. Note that in this specification, oxynitride contains more oxygen than nitrogen, and nitride oxide contains more nitrogen than oxygen.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display device.

This embodiment can be combined with any of the other embodiments as appropriate.

Embodiment 5

In this embodiment, a structure example of an OS transistor that can be used in any of the above embodiments is described.

<Structure Example of Transistor>

FIG. 15A is a top view illustrating a structure example of a transistor. FIG. 15B is a cross-sectional view taken along the line X1-X2 in FIG. 15A. FIG. 15C is a cross-sectional view taken along the line Y1-Y2 in FIG. 15A. In some cases, the direction of the line X1-X2 is referred to as a channel length direction, and the direction of the line Y1-Y2 is referred to as a channel width direction. FIG. 15B illustrates a cross-sectional structure of the transistor in the channel length direction, and FIG. 15C illustrates a cross-sectional structure of the transistor in the channel width direction. Note that to clarify the device structure, FIG. 15A does not illustrate some components.

The semiconductor device of one embodiment of the present invention includes insulating layers 812 to 820, metal oxide films 821 to 824, and conductive layers 850 to 853. A transistor 801 is formed over an insulating surface. FIGS. 15A to 15C illustrate a case where the transistor 801 is formed over an insulating layer 811. The transistor 801 is covered with the insulating layer 818 and the insulating layer 819.

Note that the insulating layers, the metal oxide films, the conductive layers, and the like that constitute the transistor 801 may each be a single film, or a stack including a plurality of films. These films and layers can be formed by any of a variety of deposition methods such as a sputtering method, a molecular beam epitaxy (MBE) method, a pulsed laser ablation (PLA) method, a CVD method, and an atomic layer deposition (ALD) method. Examples of a CVD method include a plasma-enhanced CVD method, a thermal CVD method, and a metal organic CVD method.

The conductive layer 850 includes a region that functions as a gate electrode of the transistor 801. The conductive layer 851 and the conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer that is composed of the insulating layers 814 to 816 includes a region that functions as a gate insulating layer on the back gate electrode side. The insulating layer 818 functions as an interlayer insulating layer. The insulating layer 819 functions as a barrier layer.

The metal oxide films 821 to 824 are collectively referred to as an oxide layer 830. As illustrated in FIGS. 15B and 15C, the oxide layer 830 includes a region where the metal oxide film 821, the metal oxide film 822, and the metal oxide film 824 are stacked in this order. In addition, a pair of the metal oxide films 823 is positioned over the conductive layer 851 and the conductive layer 852. When the transistor 801 is on, a channel formation region is mainly formed in the metal oxide film 822 of the oxide layer 830.

The metal oxide film 824 covers the metal oxide films 821 to 823, the conductive layer 851, and the conductive layer 852. The insulating layer 817 is positioned between the metal oxide film 824 and the conductive layer 850. The conductive layers 851 and 852 each include a region that overlaps with the conductive layer 850 with the metal oxide film 823, the metal oxide film 824, and the insulating layer 817 positioned therebetween.

The conductive layers 851 and 852 are fabricated from a hard mask that is used in the formation of the metal oxide films 821 and 822. Thus, the conductive layers 851 and 852 do not include a region that is in contact with the side surfaces of the metal oxide films 821 and 822. For example, the metal oxide films 821 and 822 and the conductive layers 851 and 852 can be formed through the following steps. First, a conductive film is formed over a two-layered metal oxide film. The conductive film is processed (etched) into a desired shape, forming a hard mask. The hard mask is used to process the shape of the two-layered metal oxide film, forming the metal oxide films 821 and 822 that are stacked. Next, the hard mask is processed into a desired shape, forming the conductive layers 851 and 852.

Examples of insulating materials used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed using a single-layer structure or a stacked-layer structure containing any of these insulating materials. The layers used for the insulating layers 811 to 818 may include a plurality of insulating materials.

Note that in this specification and the like, an oxynitride refers to a compound that contains more oxygen than nitrogen, and a nitride oxide refers to a compound that contains more nitrogen than oxygen.

In order to suppress the increase in oxygen vacancies in the oxide layer 830, the insulating layers 816 to 818 preferably contain oxygen. Further preferably, the insulating layers 816 to 818 are each formed using an insulating film from which oxygen is released by heating (hereinafter, such an insulating film is also referred to as an insulating film containing excess oxygen). When oxygen is supplied from the insulating film containing excess oxygen to the oxide layer 830, the oxygen vacancies in the oxide layer 830 can be compensated. Thus, the reliability and electrical characteristics of the transistor 801 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 812 to 819 is preferably low in order to prevent an increase in the concentration of hydrogen in the oxide layer 830. In particular, the concentration of hydrogen in the insulating layers 813 to 818 is preferably low. Specifically, the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$.

The concentration of nitrogen in the insulating layers 813 to 818 is preferably low in order to prevent an increase in the concentration of nitrogen in the oxide layer 830. Specifically, the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

The hydrogen concentration and the nitrogen concentration are measured by secondary ion mass spectrometry (SIMS).

In the transistor 801, the oxide layer 830 is preferably surrounded by an insulating layer with oxygen and hydrogen barrier properties (hereinafter, such an insulating layer is also referred to as a barrier layer). A use of such a structure prevents release of oxygen from the oxide layer 830, and intrusion of hydrogen into the oxide layer 830. Thus, the reliability and electrical characteristics of the transistor 801 can be improved.

For example, the insulating layer 819 functions as a barrier layer and at least one of the insulating layers 811, 812, and 814 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 818 is described. In this example, each of the insulating layers 811, 812, 815, and 819 functions as a barrier layer. The insulating layers 816 to 818 are oxide layers containing excess oxygen. The insulating layer 811 is formed using silicon nitride. The insulating layer 812 is formed using aluminum oxide. The insulating layer 813 is formed using silicon oxynitride. The insulating layers 814 to 816 functioning as the gate insulating layers on the back gate electrode side are formed using a stack including silicon oxide, aluminum oxide, and silicon oxide. The insulating layer 817 functioning as the gate insulating layer on the front gate side is formed using silicon oxynitride. The insulating layer 818 functioning as the interlayer insulating layer is formed using silicon oxide. The insulating layer 819 is formed using aluminum oxide.

Examples of a conductive material used for the conductive layers 850 to 853 include a metal such as molybdenum, titanium, tantalum, tungsten, aluminum, copper, chromium, neodymium, or scandium; and a metal nitride containing any of the above metals as its component (e.g., tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 850 to 853 is described. The conductive layer 850 is a single layer of tantalum nitride or tungsten. Alternatively, the conductive layer 850 is a stack including tantalum nitride, tantalum, and tantalum nitride. The conductive layer 851 is formed with a single layer of tantalum nitride, or a stack including tantalum nitride and tungsten. The structure of the conductive layer 852 is the same as that of the conductive layer 851. The conductive layer 853 is a single layer of tantalum nitride or a stack of tantalum nitride and tungsten (the conductive layers 853a and 853b).

In order to reduce the off-state current of the transistor 801, for example, the energy gap of the metal oxide film 822 is preferably large. The energy gap of the metal oxide film 822 is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

The oxide layer 830 preferably exhibits crystallinity. At least the metal oxide film 822 preferably exhibits crystallinity. With the structure described above, the transistor 801 can have high reliability and favorable electrical characteristics.

As the oxide of the metal oxide film 822, for example, an In—Ga oxide, an In—Zn oxide, or an In-M-Zn oxide (M is Al, Ga, Y, or Sn) can be used. The metal oxide film 822 is not limited to the oxide layer containing indium. The metal oxide film 822 can be formed using a Zn—Sn oxide, a Ga—Sn oxide, or a Zn—Mg oxide, for example. The metal oxide films 821, 823, and 824 can be formed using an oxide that is similar to the oxide of the metal oxide film 822. In particular, each of the metal oxide films 821, 823 and 824 can be formed with Ga oxide.

When an interface level is formed at the interface between the metal oxide film 822 and the metal oxide film 821, a channel formation region is formed also in the vicinity of the interface, which causes a change in the threshold voltage of the transistor 801. It is preferable that the metal oxide film 821 contain at least one of the metal elements contained in the metal oxide film 822 as its component. Accordingly, an interface level is unlikely to be formed at the interface between the metal oxide film 822 and the metal oxide film 821, and variations in the electrical characteristics of the transistor 801, such as the threshold voltage can be reduced.

The metal oxide film 824 preferably contains at least one of the metal elements contained in the metal oxide film 822 as its component because interface scattering is unlikely to occur at the interface between the metal oxide film 822 and the metal oxide film 824, and carrier transfer is not inhibited. Thus, the field-effect mobility of the transistor 801 can be increased.

It is preferable that the metal oxide film 822 have the highest carrier mobility among the metal oxide films 821 to 824. Accordingly, a channel can be formed in the metal oxide film 822 that is apart from the insulating layers 816 and 817.

For example, in a metal oxide containing indium such as an In-M-Zn oxide, carrier mobility can be increased by an increase in the indium content. In the In-M-Zn oxide, the s orbital of heavy metal mainly contributes to carrier transfer, and when the indium content in the oxide semiconductor is increased, overlaps of the s orbitals of indium atoms are increased; therefore, an oxide having a high content of indium has higher mobility than an oxide having a low content of indium. Therefore, an oxide having a high content of indium is used as the metal oxide film, so that carrier mobility can be increased.

Thus, for example, the metal oxide film 822 is formed using an In—Ga—Zn oxide, and the metal oxide films 821 and 823 are formed using a Ga oxide. For example, when the metal oxide films 821 to 823 are formed using an In-M-Zn oxide, the indium content of the metal oxide film 822 is made higher than the indium content of the metal oxide films 821 and 823. In the case where the In-M-Zn oxide is formed by sputtering, the indium content can be changed by a change in the atomic ratio of metal elements of a target.

For example, it is preferable that the atomic ratio of metal elements of a target used for depositing the metal oxide film 822 be In:M:Zn=1:1:1, 3:1:2, or 4:2:4.1. For example, it is preferable that the atomic ratio of metal elements of a target used for depositing the metal oxide films 821 and 823 be In:M:Zn=1:3:2, or 1:3:4. The atomic ratio of an In-M-Zn oxide deposited using a target of In:M:Zn=4:2:4.1 is approximately In:M:Zn=4:2:3.

In order that the transistor 801 have stable electrical characteristics, it is preferable to reduce the concentration of impurities in the oxide layer 830. In the metal oxide, hydrogen, nitrogen, carbon, silicon, and a metal element other than a main component are impurities. For example, hydrogen and nitrogen form donor levels to increase the carrier density. In addition, silicon and carbon form impurity levels in the metal oxide. The impurity levels serve as traps and might cause deterioration of electrical characteristics of the transistor.

For example, the oxide layer 830 includes a region where the concentration of silicon is lower than or equal to $2\times10^{18}$ atoms/cm$^3$, preferably lower than or equal to $2\times10^{17}$ atoms/cm$^3$. The same applies to the concentration of carbon in the oxide layer 830.

The oxide layer 830 includes a region where the concentration of alkali metal is lower than or equal to $1\times10^{18}$ atoms/cm$^3$, preferably lower than or equal to $2\times10^{16}$ atoms/cm$^3$. The same applies to the concentration of alkaline earth metal in the oxide layer 830.

The oxide layer 830 includes a region where the concentration of nitrogen is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

The oxide layer 830 includes a region where the concentration of hydrogen is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

The above concentrations of the impurities in the oxide layer 830 are measured by SIMS.

In the case where the metal oxide film 822 contains oxygen vacancies, donor levels are formed by entry of hydrogen into sites of oxygen vacancies in some cases, to cause reduction in the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by a reduction in hydrogen in the metal oxide film 822 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transistor 801 is likely to be normally on when the metal oxide film 822 contains hydrogen because the metal oxide film 822 includes a channel formation region. Accordingly, it is preferable that hydrogen in the metal oxide film 822 be reduced as much as possible.

FIGS. 15A to 15C illustrate an example in which the oxide layer 830 has a four-layer structure; however, one embodiment of the present invention is not limited thereto. For example, the oxide layer 830 can have a three-layer structure without the metal oxide film 821 or without the metal oxide film 823. Alternatively, the oxide layer 830 may include one or more metal oxide films that are similar to the metal oxide films 821 to 824 at two or more of the following positions: between given layers in the oxide layer 830, over the oxide layer 830, and below the oxide layer 830.

Figure 16:
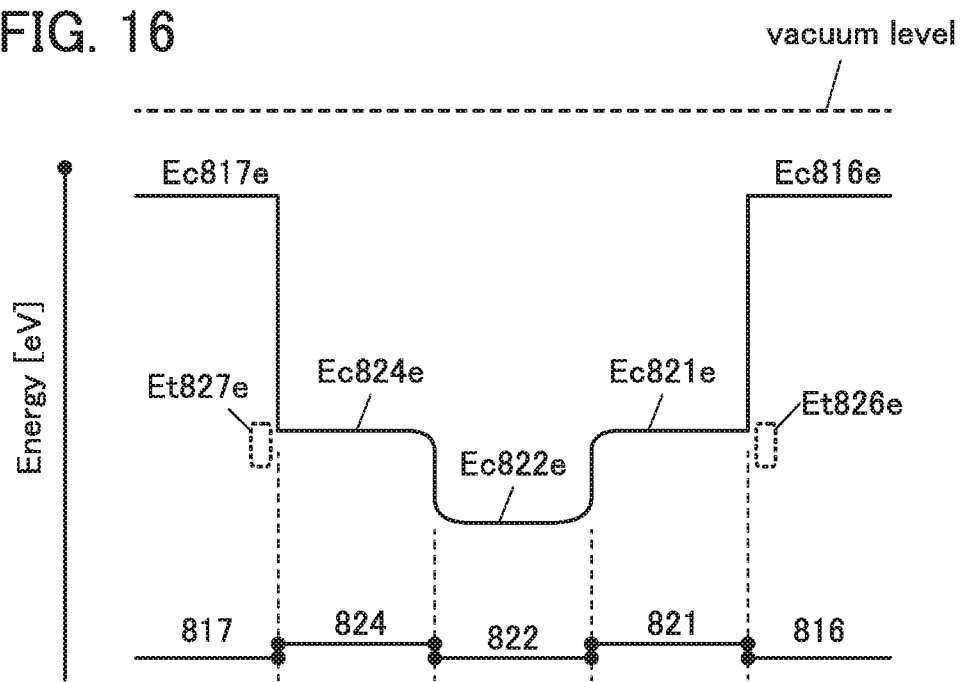
FIG. 16 is an energy band diagram.

Effects of the stack including the metal oxide films 821, 822, and 824 are described with reference to FIG. 16. FIG. 16 is a schematic diagram showing the energy band structure of a channel formation region of the transistor 801.

In FIG. 16, Ec816e, Ec821e, Ec822e, Ec824e, and Ec817e indicate the energy of the bottom of the conduction band of the insulating layer 816, the metal oxide film 821, the metal oxide film 822, the metal oxide film 824, and the insulating layer 817, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layers 816 and 817 are insulators, Ec816e and Ec817e are closer to the vacuum level than Ec821e, Ec822e, and Ec824e (i.e., the insulating layers 816 and 817 have lower electron affinities than the metal oxide films 821, 822, and 824).

The metal oxide film 822 has a higher electron affinity than the metal oxide films 821 and 824. For example, the difference in electron affinity between the metal oxide films 822 and 821 and the difference in electron affinity between the metal oxide films 822 and 824 are each greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV. Note that the electron affinity refers to a difference in energy between the vacuum level and the bottom of the conduction band.

When voltage is applied to the gate electrode (the conductive layer 850) of the transistor 801, a channel is mainly formed in the metal oxide film 822 having the highest electron affinity among the metal oxide films 821, 822, and 824.

An indium gallium oxide has low electron affinity and a high oxygen-blocking property. Therefore, the metal oxide film 824 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of the metal oxide films 821 and 822 between the metal oxide films 821 and 822. Furthermore, in some cases, there is a mixed region of the metal oxide films 824 and 822 between the metal oxide films 824 and 822. Because the mixed region has low interface state density, a region with a stack formed with the metal oxide films 821, 822, and 824 has a band structure where energy at each interface and in the vicinity of the interface is changed continuously (continuous junction).

Electrons transfer mainly through the metal oxide film 822 in the oxide layer 830 having such an energy band structure. Therefore, even when an interface state exists at an interface between the metal oxide film 821 and the insulating layer 816 or an interface between the metal oxide film 824 and the insulating layer 817, electron movement in the oxide layer 830 is less likely to be inhibited and the on-state current of the transistor 801 can be increased.

Although trap states Et826e and Et827e due to impurities or defects might be formed in the vicinity of the interface between the metal oxide film 821 and the insulating layer 816 and the vicinity of the interface between the metal oxide film 824 and the insulating layer 817 as illustrated in FIG. 16, the metal oxide film 822 can be separated from the trap states Et826e and Et827e owing to the existence of the metal oxide films 821 and 824.

Note that when a difference between Ec821e and Ec822e is small, an electron in the metal oxide film 822 might reach the trap state Et826e by passing over the difference in energy. Since the electron is trapped at the trap state Et826e, negative fixed electric charge is generated at the interface with the insulating film, causing the threshold voltage of the transistor to be shifted in a positive direction. The same applies to the case where a difference in energy between Ec822e and Ec824e is small.

Each of the difference in energy between Ec821e and Ec822e and the difference in energy between Ec824e and Ec822e is preferably greater than or equal to 0.1 eV, further preferably greater than or equal to 0.15 eV so that a change in the threshold voltage of the transistor 801 can be reduced and the transistor 801 can have favorable electrical characteristics.

Note that the transistor 801 does not necessarily include a back gate electrode.

<Example of Stacked-Layer Structure>

Next, a stacked-layer structure of an OS transistor and another transistor is described. Although an example in which the stacked-layer structure is used for the memory cell MC is described here, the stacked-layer structure can be used for other circuits described in any of the above embodiments.

Figure 17:
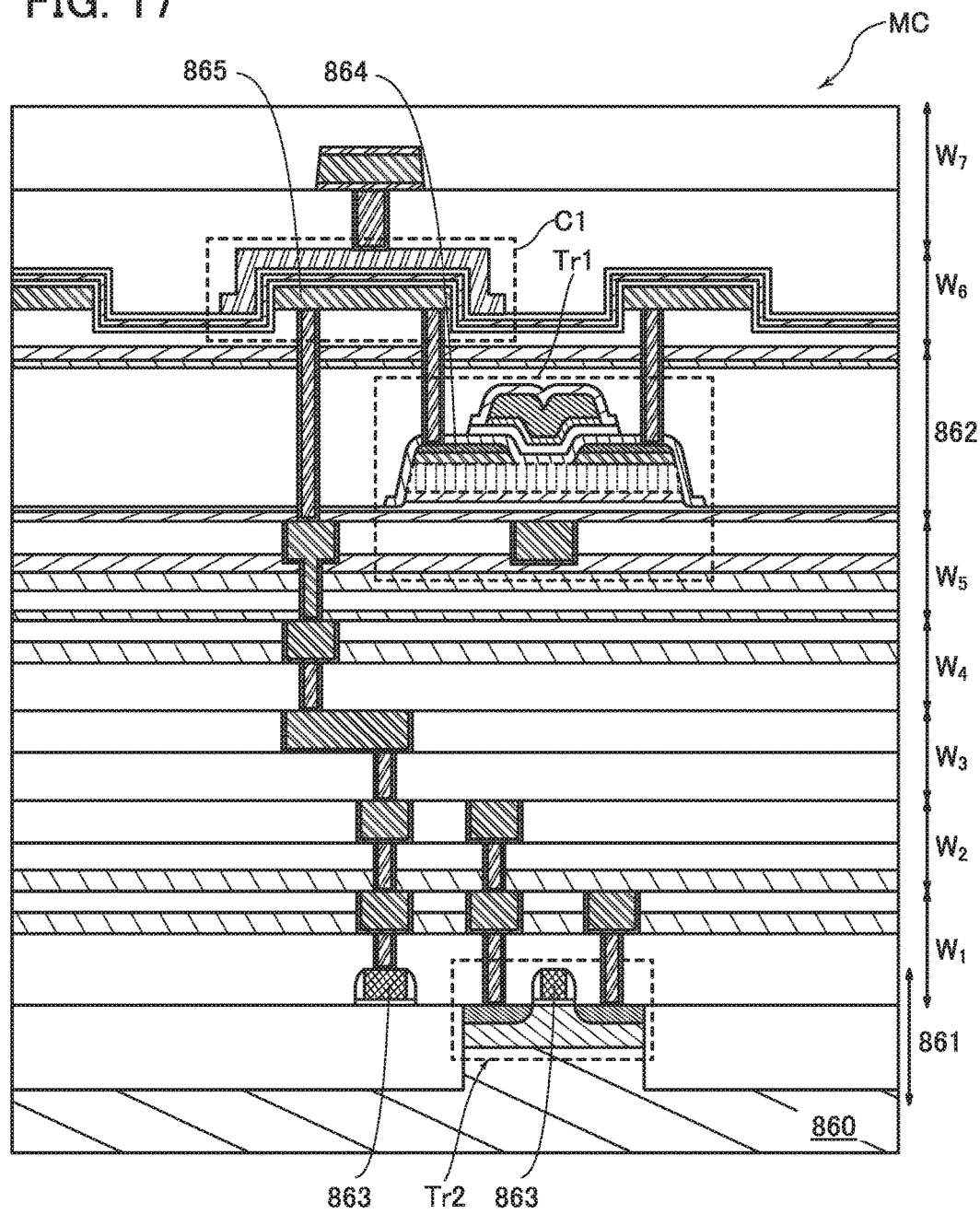
FIG. 17 is a structure example of a memory cell.

FIG. 17 illustrates an example of a stacked-layer structure of the transistor Tr1, the transistor Tr2, and the capacitor C1 that are illustrated in FIG. 2.

The memory cell MC includes a stack including a CMOS layer 861, wiring layers $W_1$ to $W_5$, a transistor layer 862, and wiring layers $W_6$ and $W_7$.

The transistor Tr2 is provided in the CMOS layer 861. The transistor Tr2 is a Si transistor. An active layer of the transistor Tr2 is formed in a single crystalline silicon wafer 860. A gate electrode 863 of the transistor Tr2 is connected to one electrode 865 of the capacitor C1 through the wiring layers $W_1$ to $W_5$.

The transistor Tr1 is provided in the transistor layer 862. The transistor Tr1 is an OS transistor. In FIG. 17, the transistor Tr1 has a structure similar to that of the transistor 801 (FIGS. 15A to 15C). An electrode 864 corresponding to one of the source and the drain of the transistor Tr1 is connected to one electrode 865 of the capacitor C1. Note that in FIG. 17, the transistor Tr1 includes its back gate electrode in the wiring layer $W_5$ as an example. The capacitor C1 is provided in the wiring layer W6.

The OS transistor and other components are stacked in this manner, whereby the area of the memory cell MC or the other circuits can be reduced.

<CAC-OS>

Next, a CAC-OS will be described. The CAC-OS may be contained in a channel formation region of an OS transistor.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. Hereinafter, this composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using $\theta/2\theta$ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices.

This embodiment can be combined with any of the other embodiments as appropriate.

Embodiment 6

In this embodiment, application examples of the semiconductor device or the like described in any of the above embodiments to an electronic component and examples of electronic devices each including the electronic component are described with reference to FIGS. 18A and 18B, FIGS. 19A and 19B, FIGS. 20A to 20D, and FIGS. 21A to 21C.

<Wafer and Chips>

Figure 18A:
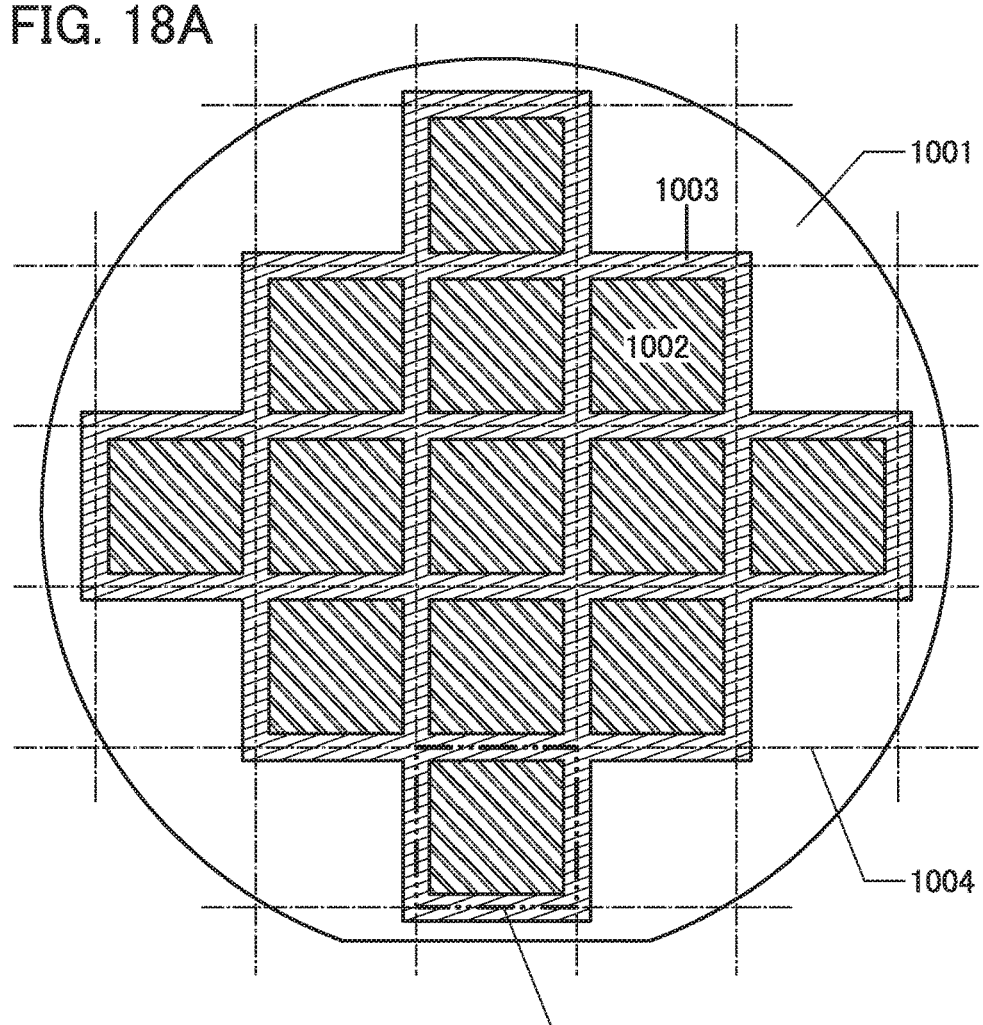
FIGS. 18A and 18B are top views of a semiconductor wafer.

FIG. 18A is a top view illustrating a substrate 1001 before dicing treatment. As the substrate 1001, a semiconductor substrate (also referred to as a "semiconductor wafer") can be used, for example. The substrate 1001 has a plurality of circuit regions 1002 thereover. The semiconductor device or the like described in any of the above embodiments can be provided in the circuit regions 1002.

Figure 18B:
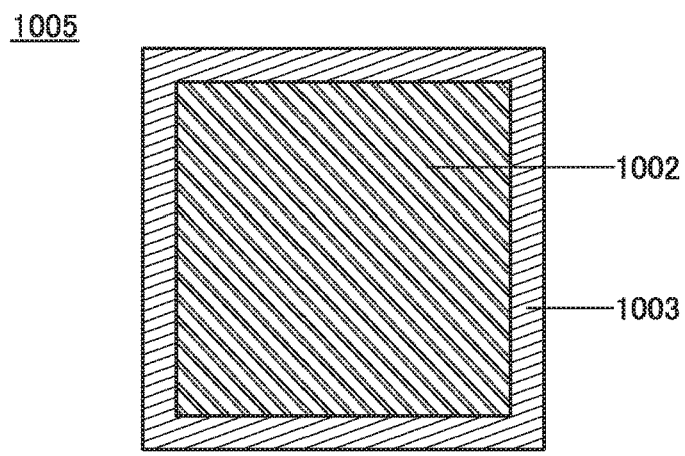

A plurality of the circuit regions 1002 are each surrounded by a separation region 1003. Separation lines (also referred to as "dicing lines") 1004 are set at a position overlapping with the separation regions 1003. The substrate 1001 can be cut along the separation lines 1004 into chips 1005 including the circuit regions 1002. FIG. 18B is an enlarged view of the chip 1005.

A conductive layer or a semiconductor layer may be provided in the separation regions 1003. Providing a conductive layer or a semiconductor layer in the separation regions 1003 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 1003 allows a reduction in the usage of the pure water. Therefore, the cost of manufacturing semiconductor devices can be reduced. Thus, semiconductor devices can be manufactured with improved productivity.

For a semiconductor layer provided in the separation regions 1003, a material whose band gap is greater than or equal to 2.5 eV and less than or equal to 4.2 eV, preferably greater than or equal to 2.7 eV and less than or equal to 3.5 eV is preferably used. The use of such a material allows accumulated charge to be released slowly; thus, the rapid move of charge due to ESD can be suppressed and electrostatic discharge damage is less likely to occur.

<Electronic Component>

Figure 19A:
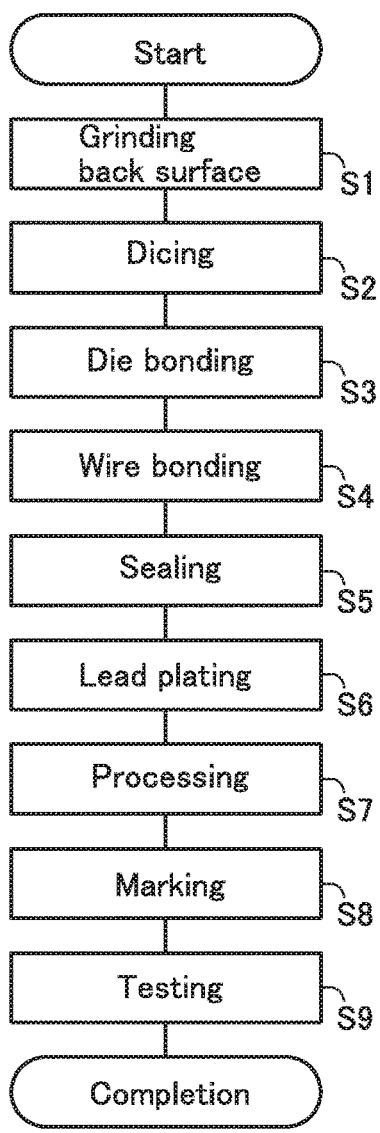
FIGS. 19A and 19B are a flow chart showing the fabrication process of an electronic component, and a perspective view of the electronic component.
Figure 19B:
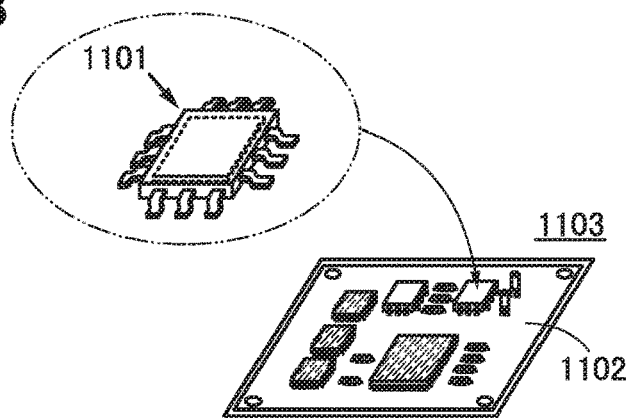

FIGS. 19A and 19B show an example where the chip 1005 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flow chart in FIG. 19A. After an element substrate including the semiconductor device described in any of the above embodiments is completed in a pre-process, a back surface grinding step in which a back surface (a surface where a semiconductor device and the like are not formed) of the element substrate is ground is performed (Step S1). When the element substrate is thinned by grinding, warpage or the like of the element substrate is reduced, so that the size of the electronic component can be reduced.

Next, the element substrate is divided into a plurality of chips in a dicing step (Step S2). Then, the divided chips are separately picked up to be bonded to a lead frame in a die bonding step (Step S3). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S4). A silver line or a gold line can be used as the metal wire. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, so that a circuit portion incorporated in the chip and wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating process prevents rust of the lead and facilitates soldering at the time of providing the chip on a printed circuit board in a later step. Then, the lead is cut and processed in a shaping step (Step S7).

Next, a printing (marking) step is performed on a surface of the package (Step S8). After a testing step (Step S9) for checking whether an external shape is good and whether there is malfunction, for example, the electronic component is completed.

FIG. 19B is a schematic perspective diagram of a completed electronic component. FIG. 19B shows a schematic perspective diagram of a quad flat package (QFP) as an example of the electronic component. An electronic component 1101 in FIG. 19B includes a semiconductor device. As the semiconductor device, the semiconductor device described in any of the above embodiments can be used.

The electronic component 1101 in FIG. 19B is, for example, mounted on a printed circuit board 1102. A plurality of the electronic components 1101 are used in combination and electrically connected to each other over the printed circuit board 1102; thus, a substrate 1103 on which the electronic components are mounted is completed. The completed substrate 1103 is provided in an electronic device or the like.

<Electronic Device>

The substrate 1103 described above can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multi-function printers, automated teller machines (ATM), vending machines, and consumer electronics.

Configuration examples of an electronic device are described below with reference to FIGS. 20A to 20D and FIGS. 21A to 21C. Note that a touch panel device including a touch sensor is preferably used for a display portion of each of the electronic devices. With the touch panel device, the display portion can also function as an input portion of the electronic device.

Figure 20A:
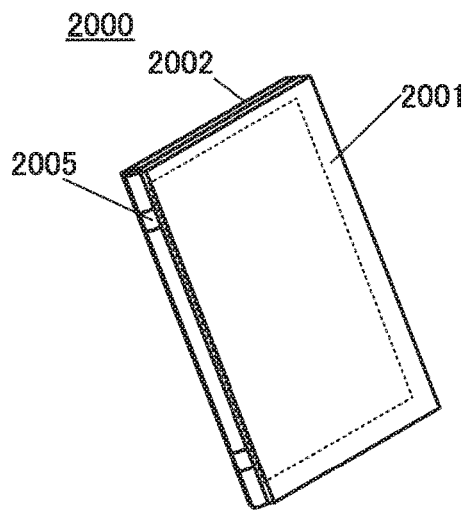
FIGS. 20A to 20D illustrate structure examples of electronic devices.
Figure 20B:
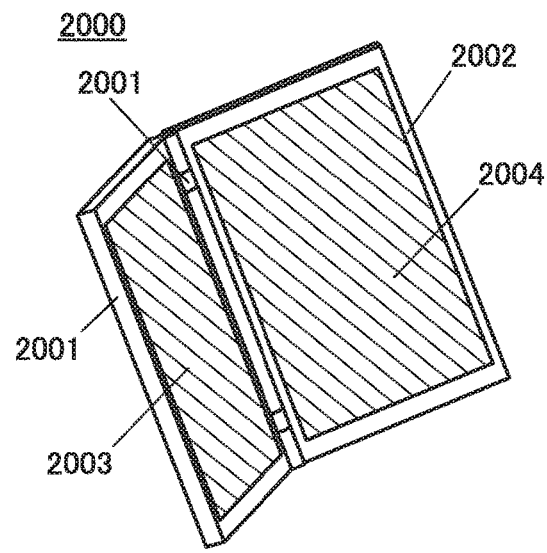

FIGS. 20A and 20B illustrate an example of a portable information terminal 2000. The portable information terminal 2000 includes a housing 2001, a housing 2002, a display portion 2003, a display portion 2004, a hinge portion 2005, and the like.

The housing 2001 and the housing 2002 are connected with the hinge portion 2005. The portable information terminal 2000 folded as in FIG. 20A can be changed into the state illustrated in FIG. 20B, in which the housing 2001 and the housing 2002 are opened.

For example, the portable information terminal 2000 can also be used as an e-book reader, in which the display portion 2003 and the display portion 2004 each can display text data. In addition, the display portion 2003 and the display portion 2004 each can display a still image or a moving image. Furthermore, the display portion 2003 may include a touch panel.

In this manner, the portable information terminal 2000 has high versatility because it can be folded when carried.

Note that the housing 2001 and the housing 2002 may include a power switch, an operation button, an external connection port, a speaker, a microphone, and/or the like.

Note that the portable information terminal 2000 may have a function of identifying a letter, a figure, or an image using a touch sensor provided for the display portion 2003. In this case, learning in the following mode becomes possible: an answer is written with a finger, a stylus pen, or the like on an information terminal that displays a workbook or the like for studying mathematics or for learning language, and then the portable information terminal 2000 determines whether the answer is correct or not. The portable information terminal 2000 may have a function of performing speech interpretation. In this case, for example, the portable information terminal 2000 can be used in learning a foreign language. Such a portable information terminal is suitable for use as a teaching material such as a textbook, a notebook, or the like.

Figure 20C:
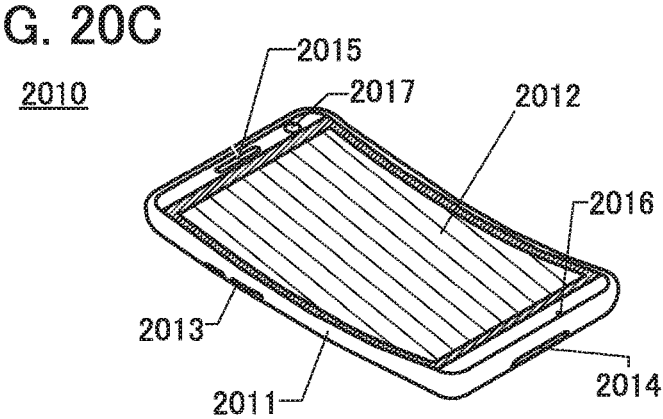

FIG. 20C illustrates an example of a portable information terminal. A portable information terminal 2010 illustrated in FIG. 20C includes a housing 2011, a display portion 2012, an operation button 2013, an external connection port 2014, a speaker 2015, a microphone 2016, a camera 2017, and the like.

The portable information terminal 2010 includes a touch sensor in the display portion 2012. Operations such as making a call and inputting a letter can be performed by touch on the display portion 2012 with a finger, a stylus, or the like.

With the operation button 2013, power ON or OFF can be switched. In addition, types of images displayed on the display portion 2012 can be switched; for example, switching images from a mail creation screen to a main menu screen is performed with the operation button 2013.

When a detection device such as a gyroscope sensor or an acceleration sensor is provided inside the portable information terminal 2010, the direction of display on the screen of the display portion 2012 can be automatically changed by determining the orientation of the portable information terminal 2010 (whether the portable information terminal 2010 is placed horizontally or vertically). Furthermore, the direction of display on the screen can be changed by touch on the display portion 2012, operation with the operation button 2013, sound input using the microphone 2016, or the like.

The portable information terminal 2010 functions as, for example, one or more of a telephone set, a notebook, and an information browsing system. For example, the portable information terminal 2010 can be used as a smartphone. The portable information terminal 2010 is capable of executing a variety of applications such as mobile phone calls, e-mails, viewing and editing texts, music reproduction, replaying video, Internet communication, and computer games.

Figure 20D:
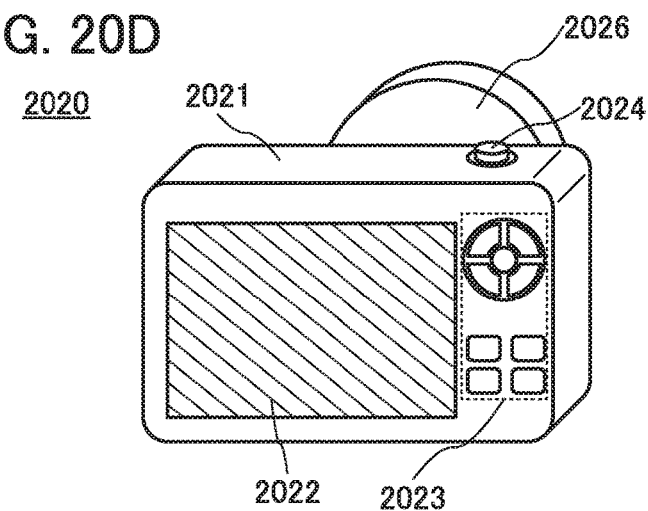

FIG. 20D illustrates an example of a camera. A camera 2020 includes a housing 2021, a display portion 2022, operation buttons 2023, a shutter button 2024, and the like. Furthermore, an detachable lens 2026 is attached to the camera 2020.

Although the lens 2026 of the camera 2020 here is detachable from the housing 2021 for replacement, the lens 2026 may be included in the housing.

Still and moving images can be taken with the camera 2020 at the press of the shutter button 2024. In addition, images can be taken at the touch of the display portion 2022 which functions as a touch panel.

Note that a stroboscope, a viewfinder, and the like can be additionally attached to the camera 2020. Alternatively, these may be included in the housing 2021.

Figure 21A:
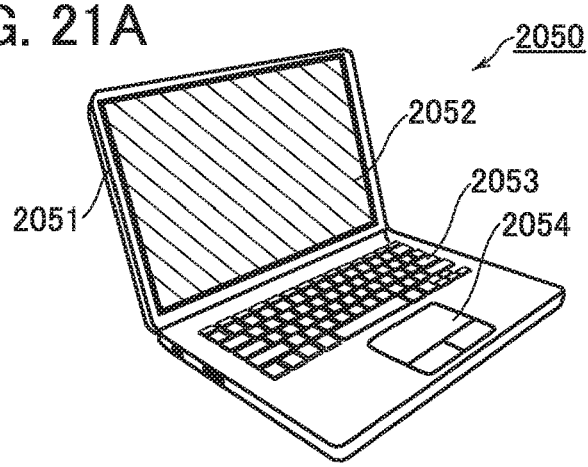
FIGS. 21A to 21C illustrate structure examples of electronic devices.

A laptop personal computer (PC) 2050 in FIG. 21A includes a housing 2051, a display portion 2052, a keyboard 2053, and a pointing device 2054. The laptop personal computer 2050 can be operated by touch operation on the display portion 2052.

Figure 21B:
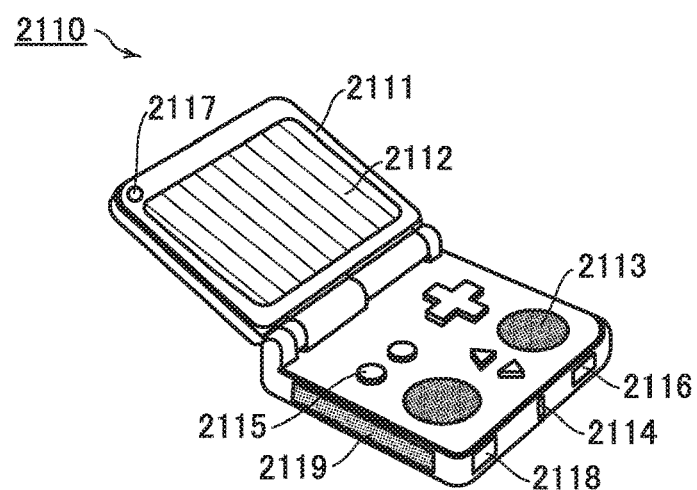

A portable game machine 2110 in FIG. 21B includes a housing 2111, a display portion 2112, speakers 2113, an LED lamp 2114, operation key buttons 2115, a connection terminal 2116, a camera 2117, a microphone 2118, and a recording medium read portion 2119.

Figure 21C:
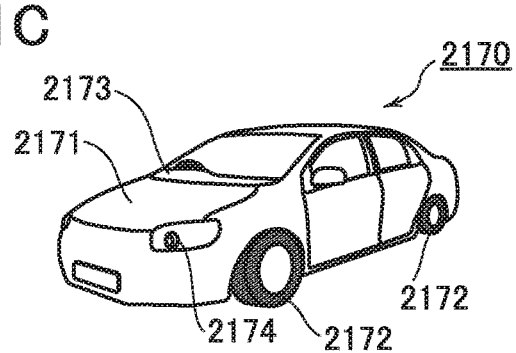

A motor vehicle 2170 in FIG. 21C includes a car body 2171, wheels 2172, a dashboard 2173, lights 2174, and the like. The motor vehicle 2170 may include a display portion.

The memory device of one embodiment of the present invention, a computer, or the like can be provided in each of the above electronic devices. Thus, highly reliable electronic devices can be achieved. Moreover, a highly reliable display system can be achieved by providing a control circuit, which includes the memory device of one embodiment of the present invention, in each of the electronic devices and providing the display portion of one embodiment of the present invention as a display portion of each of the electronic devices.

This embodiment can be combined with any of the other embodiments as appropriate.

This application is based on Japanese Patent Application Serial No. 2016-134445 filed with Japan Patent Office on Jul. 6, 2016, the entire contents of which are hereby incorporated by reference.

What is claimed is:
1. A semiconductor device comprising:
a first transistor;
a second transistor;
a first capacitor;
a third transistor;
a fourth transistor;
a second capacitor; and
first to eighth wirings,
wherein a gate of the first transistor is electrically connected to one of a source and a drain of the third transistor, a gate of the fourth transistor, and one electrode of the second capacitor,
wherein a gate of the third transistor is electrically connected to one of a source and a drain of the first transistor, a gate of the second transistor, and one electrode of the first capacitor,
wherein the other of the source and the drain of the first transistor is electrically connected to the first wiring,
wherein one of a source and a drain of the second transistor is electrically connected to the second wiring,
wherein the other of the source and the drain of the second transistor is electrically connected to the third wiring,
wherein the other electrode of the first capacitor is electrically connected to the fourth wiring,
wherein the other of the source and the drain of the third transistor is electrically connected to the fifth wiring, wherein one of a source and a drain of the fourth transistor is electrically connected to the sixth wiring, wherein the other of the source and the drain of the fourth transistor is electrically connected to the seventh wiring, and wherein the other electrode of the second capacitor is electrically connected to the eighth wiring.

2. The semiconductor device according to claim 1, wherein a positive potential and a negative potential are held in each of a node electrically connected to the one of the source and the drain of the first transistor and a node electrically connected to the one of the source and the drain of the third transistor.

3. The semiconductor device according to claim 1, wherein a potential of a node electrically connected to the one of the source and the drain of the first transistor is controlled by controlling a potential of the second wiring or a potential of the fourth wiring, and wherein a potential of a node electrically connected to the one of the source and the drain of the third transistor is controlled by controlling a potential of the sixth wiring or a potential of the eighth wiring.

4. The semiconductor device according to claim 1, wherein the first transistor and the third transistor each comprise a metal oxide in a channel formation region.

5. A memory device comprising:

the semiconductor device according to claim 1;

a first driver circuit;

a second driver circuit; and a third driver circuit, wherein the first driver circuit is configured to control a potential of the first wiring, a potential of the second wiring, a potential of the fifth wiring, and a potential of the sixth wiring, wherein the second driver circuit is configured to control a potential of the third wiring and a potential of the seventh wiring, and wherein the third driver circuit is configured to control a potential of the fourth wiring and a potential of the eighth wiring.

6. A display system comprising:

a control circuit comprising:
 a frame memory comprising the semiconductor device according to claim 1;
 an image processing portion; and
 a driver circuit; and a display portion, wherein the frame memory is configured to store image data, wherein the image processing portion is configured to perform image processing on the image data input from the frame memory to generate a video signal, and wherein the driver circuit is configured to output the video signal input from the image processing portion to the display portion.

7. The display system according to claim 6, wherein the display portion comprises a first display unit and a second display unit, wherein the first display unit comprises a reflective liquid crystal element, and wherein the second display unit comprises a light-emitting element.

8. A semiconductor device comprising a memory cell, the memory cell comprising:

a first transistor;

a second transistor;

a first capacitor;

a third transistor;

a fourth transistor;

a second capacitor; and first to eighth wirings, wherein a gate of the first transistor is electrically connected to one of a source and a drain of the third transistor, a gate of the fourth transistor, and one electrode of the second capacitor, wherein a gate of the third transistor is electrically connected to one of a source and a drain of the first transistor, a gate of the second transistor, and one electrode of the first capacitor, wherein the other of the source and the drain of the first transistor is electrically connected to the first wiring, wherein one of a source and a drain of the second transistor is electrically connected to the second wiring, wherein the other of the source and the drain of the second transistor is electrically connected to the third wiring, wherein the other electrode of the first capacitor is electrically connected to the fourth wiring, wherein the other of the source and the drain of the third transistor is electrically connected to the fifth wiring, wherein one of a source and a drain of the fourth transistor is electrically connected to the sixth wiring, wherein the other of the source and the drain of the fourth transistor is electrically connected to the seventh wiring, and wherein the other electrode of the second capacitor is electrically connected to the eighth wiring.

9. The semiconductor device according to claim 8, wherein a positive potential and a negative potential are held in each of a node electrically connected to the one of the source and the drain of the first transistor and a node electrically connected to the one of the source and the drain of the third transistor.

10. The semiconductor device according to claim 8, wherein a potential of a node electrically connected to the one of the source and the drain of the first transistor is controlled by controlling a potential of the second wiring or a potential of the fourth wiring, and wherein a potential of a node electrically connected to the one of the source and the drain of the third transistor is controlled by controlling a potential of the sixth wiring or a potential of the eighth wiring.

11. The semiconductor device according to claim 8, wherein the first transistor and the third transistor each comprise a metal oxide in a channel formation region.

12. A memory device comprising:

the semiconductor device according to claim 8;

a first driver circuit;

a second driver circuit; and a third driver circuit, wherein the first driver circuit is configured to control a potential of the first wiring, a potential of the second wiring, a potential of the fifth wiring, and a potential of the sixth wiring, wherein the second driver circuit is configured to control a potential of the third wiring and a potential of the seventh wiring, and wherein the third driver circuit is configured to control a potential of the fourth wiring and a potential of the eighth wiring.

13. A display system comprising:

a control circuit comprising:
 a frame memory comprising the semiconductor device according to claim 8;
 an image processing portion; and a driver circuit; and a display portion, wherein the frame memory is configured to store image data, wherein the image processing portion is configured to perform image processing on the image data input from the frame memory to generate a video signal, and wherein the driver circuit is configured to output the video signal input from the image processing portion to the display portion.

14. The display system according to claim 13, wherein the display portion comprises a first display unit and a second display unit, wherein the first display unit comprises a reflective liquid crystal element, and wherein the second display unit comprises a light-emitting element.

* * * * *